(12) United States Patent
Von Känel

(10) Patent No.: US 11,024,666 B2
(45) Date of Patent: Jun. 1, 2021

(54) ELECTROMAGNETIC RADIATION DETECTOR COMPRISING CHARGE TRANSPORT ACROSS A BONDED INTERFACE

(71) Applicant: G-ray Switzerland SA, Hauterive (CH)

(72) Inventor: Hans Von Känel, Wallisellen (CH)

(73) Assignee: G-ray Switzerland SA, Hauterive (CH)

( * ) Notice: Subject to any disclaimer, the term of this patent is extended or adjusted under 35 U.S.C. 154(b) by 92 days.

(21) Appl. No.: 16/324,125

(22) PCT Filed: Aug. 29, 2017

(86) PCT No.: PCT/IB2017/001032
§ 371 (c)(1),
(2) Date: Feb. 8, 2019

(87) PCT Pub. No.: WO2018/042242
PCT Pub. Date: Mar. 8, 2018

(65) Prior Publication Data
US 2019/0172860 A1    Jun. 6, 2019

Related U.S. Application Data

(60) Provisional application No. 62/381,647, filed on Aug. 31, 2016.

(51) Int. Cl.
*H01L 27/146* (2006.01)
*H01L 27/15* (2006.01)
*H01L 25/16* (2006.01)

(52) U.S. Cl.
CPC ........ *H01L 27/1469* (2013.01); *H01L 25/167* (2013.01); *H01L 27/14632* (2013.01);
(Continued)

(58) Field of Classification Search
None
See application file for complete search history.

(56) References Cited

U.S. PATENT DOCUMENTS

| 9,123,607 B1* | 9/2015 | Hatcher | ............ H01L 27/14634 |
| 2015/0060681 A1* | 3/2015 | Chappo | .................. G01T 1/2928 |
| | | | 250/370.09 |
| 2018/0122851 A1* | 5/2018 | Ettenberg | ............ H01L 31/1844 |

FOREIGN PATENT DOCUMENTS

| EP | 0 571 135 A2 | 11/1993 |
| EP | 0 820 104 A2 | 1/1998 |
| WO | WO 2016/097850 A1 | 6/2016 |

OTHER PUBLICATIONS

Snoeys W ED—Unno Yoshinobu et al: "Monolithic pixel detectors for high enery physics", Dec. 11, 2013, whole document.
(Continued)

*Primary Examiner* — Hoon K Song
(74) *Attorney, Agent, or Firm* — Da Vinci Partners LLC; John Moetteli

(57) ABSTRACT

Monolithic CMOS integrated pixel detector (10, 20, 30, 260, 470, 570), and systems and methods are provided for the detection and imaging of electromagnetic radiation with high spectral and spatial resolution. Such detectors comprise a Si wafer with a CMOS processed readout bonded to an absorber wafer in an electrically conducting covalent wafer bond. The pixel detectors, systems and methods are used in various medical and non-medical types of applications.

44 Claims, 6 Drawing Sheets

(52) U.S. Cl.
CPC .. *H01L 27/14634* (2013.01); *H01L 27/14643* (2013.01); *H01L 27/14658* (2013.01); *H01L 27/14661* (2013.01); *H01L 27/14676* (2013.01); *H01L 27/14694* (2013.01); *H01L 27/156* (2013.01); *H01L 27/14696* (2013.01)

(56) References Cited

OTHER PUBLICATIONS

Jacob Day et al: "III-Nitride full-scale high-resolution microdisplays", Jul. 22, 2011, whole document.
C. Flötgen et al: "Novel Surface Preparation Methods for Covalent and Conductive Bonded Interface Fabrication", 2014, whole document.
I. Åberg et al: "A Low Dark Current and High Quantum Efficiency Monolithic Germanium-on-Silicon CMOS Imager Technology for Day and Night Imaging Applications",2010, whole doc.
Lorenzo Colace et al: "Low Dark-Current Germanium-on-Silicon Near-Infrared Detectors", Nov. 15, 2007, whole document.
Grzegorz W. Deptuch et al: "Vertically Integrated Circuits at Fermilab", Aug. 4, 2010, whole document.
Julia H. Jungmann et al: "Fast, High Resolution Mass Spectrometry Imaging Using a Medipix Pixelated Detector", 2010, whole document.
I.P. Ferain et al: "Low temperature exfoliation process in hydrogen-implanted germanium layers", Mar. 9, 2010, whole document.
T. Plach et al: "Mechanism for room temperature direct wafer bonding", Mar. 7 2013, whole document.
S. Procz et al: "Medipix3 CT for material sciences", Jan. 16, 2013, whole document.
Yimin Kang et al: "Monolithic germanium/silicon avalanche photodiodes with 340 GHz gain-bandwidth product", Dec. 7, 2008, whole document.
M.C. Veale et al: "Chromium compensated gallium arsenide detectors for X-ray and y-ray spectroscopic imaging", Mar. 25, 2014, whole document.
W. Snoeys: "Monolithic pixel detectors for high energy physics", May 28, 2013, whole document.
S. Mattiazzo et al: "LePIX: First results from a novel monolithic pixel sensor", Nov. 8, 2012, whole document.
J. Weber et al: "Near-band-gap photoluminescence of Si-Ge alloys", Sep. 15, 1989, whole document.
R.C. Alig et al: "Scattering by ionization and phonon emission in semiconductors", Dec. 15, 1980, whole document.
R Casanova Alig: "Scattering by ionization and phonon emission in semiconductors. II. Monte Carlo calculations",. Jan. 15, 1983, whole document.
Conor S. Rafferty et al: "Monolithic germanium SWIR imaging array", Apr. 15, 2008, whole document.
John E. Bowers et al: "High-gain high-sensitivity resonant Ge/Si APD photodetectors", May 3, 2010, whole document.
M.D. Hörnig et al: "Design of a contrast-enhanced dual-energy tomosynthesis system for breast cancer imaging", Mar. 3, 2012, whole document.
Andras Kiss et al: "Microscope mode secondary ion mass spectrometry imaging with a Timepix detector", 2013, whole document.
Stephano Del Sordo et al:"Progress in the Development of CdTe and CdZnTe Semiconductor Radiation Detectors for Astrophysical and Medical Applications",May 12, 2009,whole doc.
Amorphous and Polycrystalline Photoconductors for Direct Conversion Flat Panel X-Ray Image Sensors, 2011, whole document.
International Search Report, International patent application No. PCT/IB2017/001032, dated Nov. 20, 2017.

\* cited by examiner

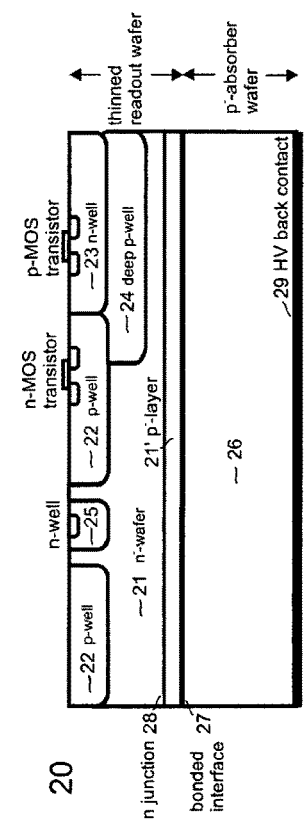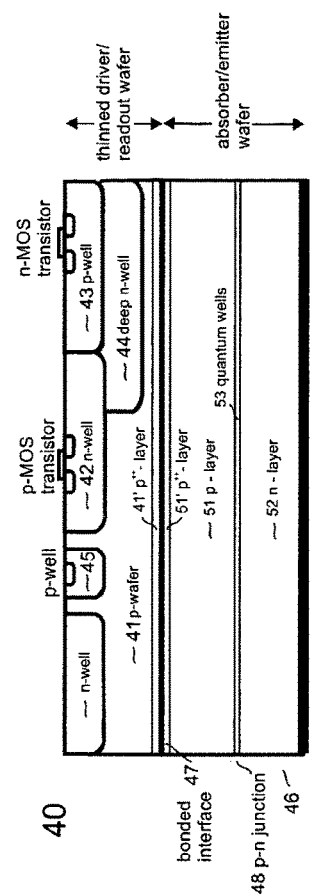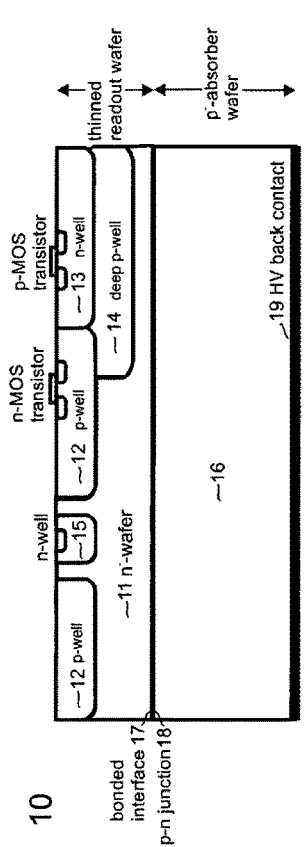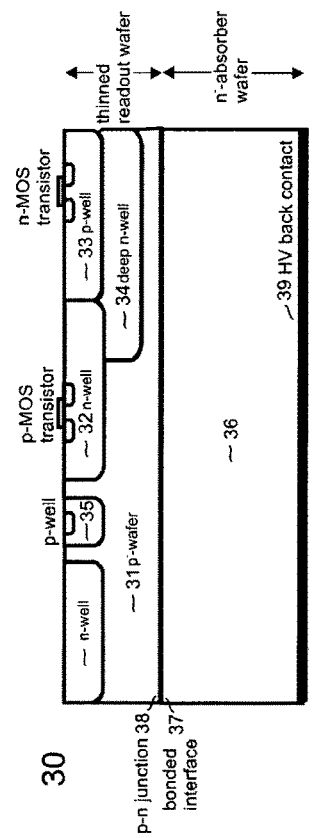

ELECTROMAGNETIC RADIATION DETECTOR COMPRISING CHARGE TRANSPORT ACROSS A BONDED INTERFACE

CROSS REFERENCE TO RELATED APPLICATIONS

This application is the National Stage of International Application No. PCT/IB2017/001032, filed Aug. 29, 2017, which claims benefit under 35 USC § 119(a), to U.S. provisional patent application Ser. No. 62/381,647, filed Aug. 31, 2016.

FIELD OF THE INVENTION

The invention relates to pixel detectors made from monolithic, Complementary Metal Oxide Semiconductor (CMOS) integrated structures for the detection and imaging of electromagnetic radiation, and to methods for forming such structures and applications thereof.

BACKGROUND OF THE INVENTION

Current digital imaging devices for electromagnetic radiation detection, also called pixel detectors, can be classified into two broad classes, distinguished by the way in which impacting photons are converted into electrical signals. Taking X-ray photons as an example, in the first one of these classes, the conversion happens indirectly in the sense that X-ray photons are first down-converted in energy to visible photons in a scintillation layer. The visible photons are subsequently detected by an array of photodiodes, in which the optical generation of electron-hole pairs gives rise to electrical signals which are then further processed by readout electronics and represented as an image on a computer screen. The two-stage conversion process of indirect X-ray imaging devices suffers from the drawback of limited conversion efficiency and spatial resolution because of losses and scattering occurring both during the conversion of X-rays into visible photons and in the detection of those. Typically about 25 electron-hole pairs are finally measured by the readout electronics per keV of incident X-ray energy.

In the second class of these pixel detectors, semiconductor absorbers permit the direct conversion of X-rays into electron-hole pairs which can then be measured as an electrical signal by readout electronics. In addition to superior sensitivity and higher spatial and temporal resolution compared to scintillator based indirect conversion, such absorbers offer also spectral resolution because the energy of an incident X-ray photon is proportional to the number of generated electron-hole pairs and thus measurable by a pulse height analysis. In silicon (Si), one needs on average 3.6 eV to create a single electron-hole pair (see, for example, R. C. Alig et al. in Phys. Rev. B 22, 5565 (1980); and R. C. Alig in Phys. Rev. B 27, 968 (1983), the entire disclosures of which are hereby incorporated by reference). On average, this leads to 280 electron-hole pairs per keV of absorbed X-ray energy, from which it can be seen that the conversion efficiency exceeds that of a scintillator-photodiode combination by more than a factor of ten.

X-ray imaging detectors, or pixel sensors in general, employing direct conversion by means of semiconductor absorbers, can be implemented in different ways. One approach used in commercial flat panel fabrication is based on polycrystalline or amorphous materials directly deposited on the readout electronics made from thin film transistors. For example, flat panel X-ray imaging detectors with amorphous selenium absorbers for medical applications are relatively inexpensive to make and offered in large sizes (see, for example, S. Kasap et al. in Sensors 11, 5112 (2011), the entire disclosure of which is hereby incorporated by reference). Materials in the form of single crystals offer, however, much better transport properties compared with their polycrystalline and amorphous counterparts. They are therefore expected to provide better detector performance. Single crystal absorbers are on the other hand incompatible with readout electronics incorporating amorphous thin film transistors. They can, in principle, be epitaxially grown on CMOS processed readout wafers, but usually only at the expense of an intolerably high thermal budget, requiring special metallization schemes compatible with elevated process temperatures (see, for example, U.S. Pat. No. 8,237,126 to von Känel, the entire disclosure of which is hereby incorporated by reference). Typically, with standard aluminium metallization, temperatures have to be kept well below 450° C.

In order to be compatible with CMOS processed readout electronics, the electrical connections between absorber and readout wafers needed to process the electrical signal from every absorber pixel have to be realized by a low-temperature wafer bonding process. The most common bonding technique is bump bonding, as used, for example, by the Medipix collaboration (www.medipix.web.cern.ch) or by Dectris AG (www.dectris.ch). The absorber can, in principle, consist of any semiconductor material suitable for energetic particle detection from which large crystals can be grown, for example, Si, Ge, SiC, GaAs, CdTe and CdZnTe (see, for example, European Patent No. 0571135 to Collins et al., the entire disclosure of which is hereby incorporated by reference).

While with bump bonding, it is hard to push the pixel size to below about 50 μm, there are other bonding technologies potentially offering higher detector resolution. One of them is, for example, known from the vertical integration of integrated circuits, so-called 3D-IC technology. Here, bump bonding is replaced by fusion bonding, comprising oxide-to-oxide fusion bonding along with metal-to-metal bonding of metallic pads surrounded by oxide. The resulting structures are indistinguishable from monolithic configurations (see, for example, G. W. Deptuch et al. in IEEE Trans. Nucl. Sci. 57, 2178 (2010), the entire disclosure of which is hereby incorporated by reference).

In yet another bonding technique, an electrically conductive, covalent bond is formed at low temperature between the absorber wafer and the readout wafer. Covalent bonding essentially leads again to a monolithic structure (see, for example, International Patent Application No. WO 2016/097850 to von Känel, the entire disclosure of which is hereby incorporated by reference). Depending on the CMOS process used, the pixel size can vary in a wide range, for example, of about 100-200 μm, 50-100 μm or 20-50 μm, 5-20 μm or even 1-5 μm.

Silicon absorbers also permit monolithic imaging detectors to be fabricated without the use of any bonding technique. Such detectors have been developed for the detection of ionizing radiation other than X-rays in high energy physics. They comprise a high-resistivity absorber layer with a resistivity typically between about 400 Ωcm and 2 kΩcm epitaxially grown on a standard Si CMOS substrate. The readout electronics is CMOS processed in this epitaxial layer and the substrate subsequently partly removed (see, for example, S. Mattiazzo et al. in Nucl. Instr. Meth. Phys. Res. A 718, 288 (2013), the entire disclosure of which is hereby incorporated by reference). While these devices are very promising for particle detection, absorbers with thicknesses much beyond those of epitaxial layers (typically a few tens of μm) are needed for efficient X-ray detection. To permit full depletion at moderate voltages of the order of 100 V, the absorber resistivity moreover needs to be much higher than the few kΩcm offered by epitaxial layers (see, for example, W. Snoeys in Nucl. Instr. Meth. Phys. Res. A 731, 125 (2013), the entire disclosure of which is hereby incorporated by reference). Finally, absorbers comprising elements with higher atomic number Z than Si ("heavier elements") are more suitable for X-rays with energies above about 40 keV because of their more efficient absorption.

It is the aim of the invention to provide a monolithic pixel sensor for electromagnetic radiation detection and imaging based on a CMOS processed wafer containing the readout electronics covalently bonded to an absorber wafer. The covalent, electrically conductive bond between readout and absorber wafer is formed at or near room-temperature.

SUMMARY OF THE INVENTION

Monolithic CMOS integrated pixel detector, and systems and methods are provided for the detection and imaging of electromagnetic radiation with high spectral and spatial resolution. Such detectors comprise a Si wafer with a CMOS processed readout bonded to an absorber wafer in an electrically conducting covalent wafer bond. The pixel detectors, systems and methods are used in various medical and non-medical types of applications.

Such a pixel detector includes several components. A first component is a silicon readout wafer with at least one high resistivity layer doped to have a first conduction type, the layer having a CMOS processed readout electronics. A second component are implants for charge collectors doped to have the first conduction type, the implants communicating with the readout electronics and defining the detector pixels. A third component is an absorber wafer made from single crystal material having at least a second conduction type and a metallic back contact. A fourth component are contact pads communicating with an external printed circuit board.

The silicon wafer and the absorber wafer are covalently bonded to form a monolithic unit. The monolithic unit incorporates a p-n junction formed by a layer of the first conduction type and a layer of the second conduction type. The depletion region of the p-n junction is disposed to extend across the bonding interface to separate electron-hole pairs into charges travelling in opposite directions when the electron-hole pairs are generated by electromagnetic radiation absorbed in the absorber wafer and when a reverse bias is applied to the back contact. The charge collectors are disposed to receive the electrical charges crossing the bonded interface. The readout electronics is disposed to convert the electrical charges into digital signals which can pass through contact pads to the external printed circuit board. Here, they can be stored, processed and displayed as images on a computer screen.

It is an object of the invention to provide a monolithic CMOS integrated pixel sensor suitable for electromagnetic radiation detection and imaging.

It is another object of the invention to provide a monolithic pixel sensor suitable for electromagnetic radiation detection and imaging, wherein the readout electronics and a single crystalline absorber are juxtaposed either on the same or on opposite sides of a CMOS processed silicon wafer thus permitting backside illumination.

It is yet another object of the invention to provide a monolithic CMOS integrated pixel sensor suitable for electromagnetic radiation detection and imaging which is fabricated by low temperature wafer bonding of the readout and absorber wafer.

It is a further object of the invention to provide a monolithic pixel sensor suitable for high-energy X-ray detection and imaging which is fabricated by bonding a CMOS processed wafer incorporating the readout electronics onto a high-Z absorber layer.

It is yet a further object of the invention to provide a monolithic pixel sensor suitable for energy-resolved X-ray detection and imaging.

It is yet another object of the invention to provide a monolithic pixel sensor capable of single-photon detection.

It is yet a further object of the invention to provide simple processes for the fabrication of monolithic pixel detectors having a thinned readout wafer covalently bonded to an absorber wafer of the opposite conduction type (i.e. opposite effective doping type).

The invention teaches the structure and fabrication methods of monolithic pixel detectors for electromagnetic radiation. The pixel detectors comprise a thin Si wafer with CMOS processed readout electronics communicating with a single crystalline absorber forming a monolithic unit. This monolithic unit is formed by wafer bonding a thinned, CMOS processed Si readout wafer onto an absorber wafer to collect and process the electrical signals generated by electromagnetic radiation incident on the absorber. Instead of generating electrical signals from absorbed electromagnetic radiation, the structure of the pixel detector can be operated in a reverse mode by adjusting doping levels and inverting the applied bias, whereby the absorber now acts as an emitter of electromagnetic radiation and the detector is transformed into a high resolution display. These and other objects of the invention are described in the drawings, specification and claims.

In the description of this invention, the terms "pixel detector" and "pixel sensor" are considered as synonyms describing the detector as a whole. Likewise, the terms "absorber wafer" and "sensor wafer" are considered synonyms of the detector part in which electromagnetic radiation is absorbed.

BRIEF DESCRIPTION OF THE DRAWINGS

FIG. 1A is a cross-sectional view of a monolithic pixel detector with the p-n junction between n-doped readout wafer and p-doped absorber wafer at the bonded interface.

FIG. 1B is a cross-sectional view of a monolithic pixel detector with the p-n junction inside the n-doped readout wafer which is bonded to a p-doped absorber wafer.

FIG. 1C is a cross-sectional view of a monolithic pixel detector with the p-n junction between p-doped readout wafer and n-doped absorber wafer at the bonded interface.

FIG. 1D is a cross-sectional view of a monolithic structure which can be operated as a pixel detector under reverse bias and as a display under forward bias.

Figure 2:
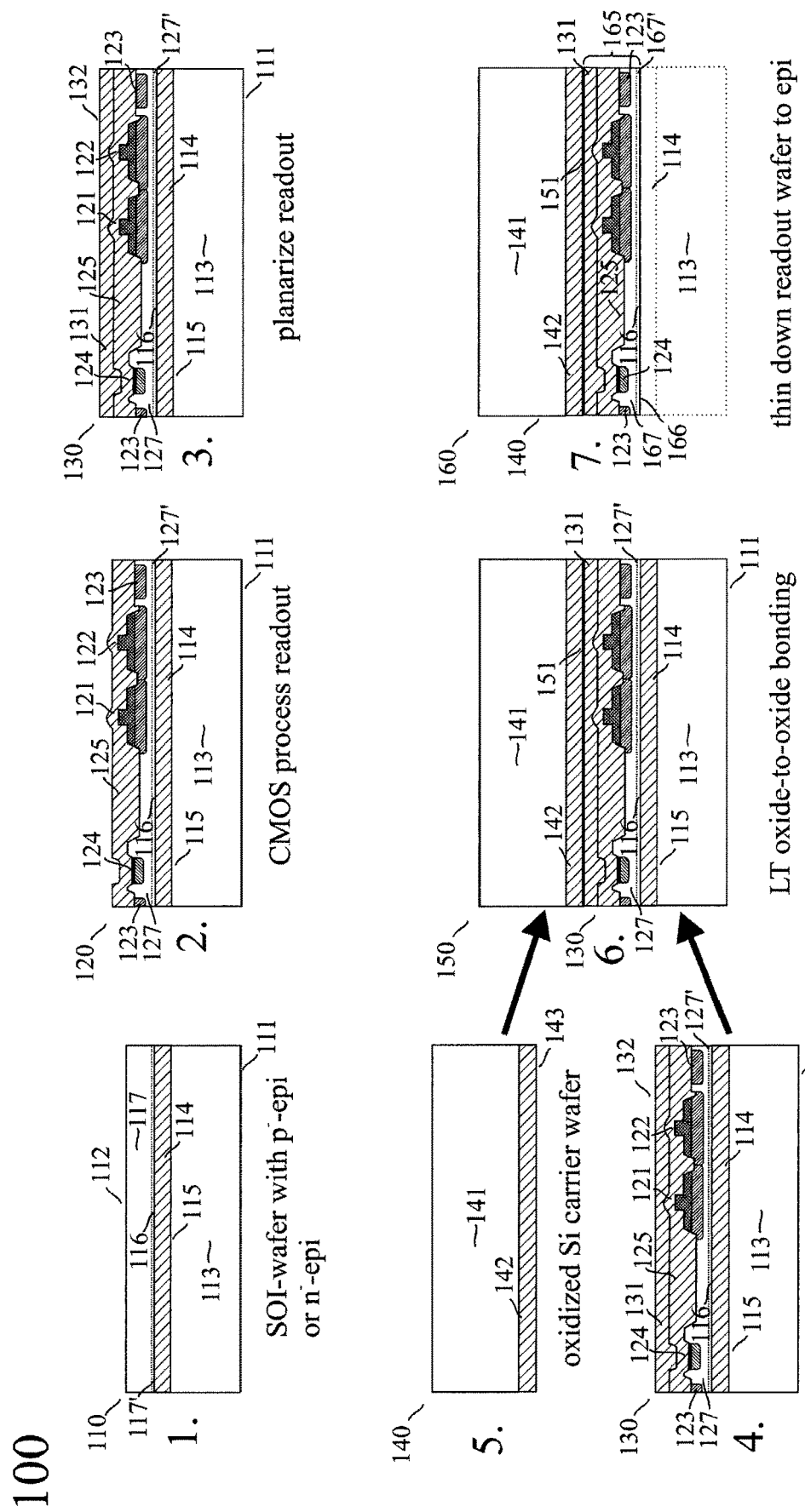
FIG. 2 is a schematic diagram of the process flow for fabrication of a thinned CMOS processed readout wafer bonded to a carrier wafer.

DETAILED DESCRIPTION OF THE
PREFERRED EMBODIMENTS

It is the aim of this invention to provide simple structures and methods for the fabrication of sensitive, large area monolithic pixel detectors, such as, for example, flat panel detectors with sizes up to about 20×20 cm$^2$ or even about 40×40 cm$^2$. The detectors are composed of a CMOS processed readout wafer covalently bonded to an absorber wafer, also called sensor wafer. It should be understood that the terms "readout wafer", "readout unit" and "readout electronics" described herein apply to the pixel readout electronics for the readout of individual detector pixels, which may be complemented by additional electronics circuits for storing, processing and transmitting data on external printed circuit boards (PCBs) representing the connection to the "outside world", such PCBs communicating with contact pads present on the CMOS processed readout wafers. The readout electronics is processed in a lightly doped epitaxial Si layer with a thickness of about 10-30 μm and a resistivity above about 500 Ωcm or preferably about 1-2 kΩcm or more preferably 2-5 kΩcm or even more preferably above 5 kΩcm, for example, 5-50 kΩcm, the resistivity being due to a low doping level between about $10^{11}$ to $10^{13}$ cm$^{-3}$ of a first conduction type (for example, n-conduction induced by n-doping). For ease of detector manufacturing, it may be advantageous to use silicon-on-insulator (SOI) wafers for the CMOS processing of the readout electronics. The detectors can detect electromagnetic radiation in a single photon detection mode. The sensor material can comprise any semiconductor available in the form of high purity wafers or in the form of epitaxial layers on a substrate, whereby the preferred substrate is Si. The conduction type of the sensor wafer should be opposite to that of the readout wafer, for example, p-conduction when the readout wafer is n-doped. The thickness and the material used for the sensor strongly depend on the energy of the electromagnetic radiation which is to be detected. For near infrared detection, for example, a Ge layer as thin as 0.5-1.5 μm or even 0.3-0.5 μm may be sufficient for efficient sensing. A SiC sensor with a thickness of about 3.5, 332 and 2310 μm is expected to absorb 90% of incident photons with energies of 2, 10 and 20 keV, respectively. A Si sensor with a thickness of about 3.9, 334 and 2330 μm is expected to absorb 90% of incident photons with energies of 2, 10 and 20 keV, respectively. For a Ge or GaAs sensor, the thickness necessary to absorb 90% of the incident photons with energy of 20, 30 and 40 keV is about 105, 320 and 710 μm, respectively. For example, a $Si_{0.2}Ge_{0.8}$ alloy would have to be about 25% thicker for the same absorption at these photon energies. Harder X-rays of 40, 60 and 80 keV are absorbed to the same extent by a CdTe sensor or a CdZnTe alloy sensor whose thickness amounts to about 210, 610 and 1310 μm, respectively (NIST X-ray attenuation data base, www.nist.gov/pml/data/ffast). The room temperature resistivity of intrinsic Ge is about 47 Ωcm and that of a $Si_{0.25}Ge_{0.75}$ alloy approximately 6×10$^4$ Ωcm (see, for example, www.virginiasemi.com/pdf/generalpropertiesSi62002.pdf). With respect to Ge and SiGe sensors, GaAs sensors have the advantage of much higher resistivity on the order of $10^9$ Ωcm (see, for example, M. C. Veale in Nucl Instr. Meth. Phys. Res, A 752, 6 (2014), the entire disclosure of which is hereby incorporated by reference). The same order of resistivity applies to CdTe sensors and even a higher one for CdZnTe alloy sensors (see, for example, L. Del Sordo et al. in Sensors 2009, 9, 3491-3526, the entire disclosure of which is hereby incorporated by reference). A sensor resistivity as high as possible is needed to keep the dark current of the detector low.

The structures and methods of the invention refer to industrial scale wafers. High vacuum bonding equipment for 200 mm wafers is manufactured, for example, by EV Group (see, for example, C. Flötgen et al. in ECS Transactions 64, 103 (2014), the entire disclosure of which is hereby incorporated by reference).

By construction, the monolithic pixel detectors of the invention are expected to offer single-photon detection. The monolithic pixel detectors of the invention are therefore suitable also for energy discrimination, whereby the energy of photons incident on the absorber can be measured by employing the pulse height analysis of the electrical pulses processed by the readout electronics.

Referring now to FIG. 1A, a first embodiment 10 of a monolithic pixel detector is incorporating a covalent bond 17 between lightly n-doped CMOS processed Si wafer 11, acting as readout wafer, and a nominally undoped (intrinsic) but p-conducting or lightly p-doped absorber wafer 16. The acceptor density of the p-doped absorber wafer 16 depends on the material used and should be chosen such that absorber wafer 16 has the highest possible resistivity. For an intrinsic Ge absorber, the room temperature resistivity is about 50 Ωcm, the rather low value of which requires detectors made with this absorber to be cooled, for example, to liquid nitrogen temperature. Absorbers made from $Si_{1-x}Ge_x$ alloys may have substantially higher resistivities, depending on the Ge concentration x, such as, for example, about 6×10$^4$ Ωcm for x=0.75 (see, for example, www.virginiasemi.com/pdf/generalpropertiesSi62002.pdf). Sensors made from Cr-doped GaAs may have an even larger resistivity of about 10$^9$ Ωcm (see, for example, M. C. Veale in Nucl. Instr. Meth. Phys. Res. A 752, 6 (2014)). Absorbers from CdTe have a similar resistivity, and those from CdZnTe alloys an even higher one (see, for example, L. Del Sordo et al. in Sensors 2009, 9, 3491-3526). Si wafer 11 preferably has a resistivity above about 500 Ωcm or 1-2 kΩcm or more preferably about 2-5 kΩcm or even above 5 kΩcm, for example, 5-50 kΩcm. The figure shows a small part of the detector in cross-section, the width of which corresponds to slightly more than single pixel size which may range, for example, from 1-5, 5-20, 20-50, 50-100 or 100-200 μm, depending on the CMOS process used. In this configuration, n-well implants 15 serve as charge collectors, collecting the electrons coming from electron-hole pairs which are generated by photons incident on absorber wafer 16 and separated in the electric field of the p-n junction formed by the n-conducting readout and the p-conducting sensor wafer. The distance between adjacent n-wells 15 defines the pixel size. In the example of FIG. 1A, the n-MOS and p-MOS transistors of the pixel electronics of the readout are situated in p-wells 12 and n-wells 13, respectively. Deep p-well 14 has the purpose of avoiding electron collection by n-wells 13 in addition to charge collecting n-well 15. In an aspect of the embodiment, part of the pixel electronics may be located in n-well 15. In the configuration of embodiment 10, bonded interface 17 serves simultaneously as a p-n junction 18 between lightly n-doped Si wafer 11 and p-conducting absorber wafer 16. When a reverse bias is applied to back contact 19, the space charge layer therefore expands from interface 17 both into wafer 11 and into absorber wafer 16.

In order to allow for efficient charge collection, readout wafer 11 should preferably be thin, such that in operation most or preferably all of the space charge region extends through both the entire readout wafer 11 and the entire absorber wafer 16. In other words, in operation readout wafer 11 and absorber wafer 16 should preferably be fully depleted especially for the efficient detection of X-ray photons. Pixel detectors 10 with absorber wafers comprising low band gap semiconductors, such as, for example, Ge, may have to be cooled by thermoelectric or liquid nitrogen cooling in order for dark currents to be sufficiently low. Dark currents should preferably be below about 1 µA per pixel or even more preferably below 1 nA per pixel. The thickness of readout wafer 11 is preferably kept below about 30 µm, or more preferably between about 5-25 µm, or, even more preferably, between about 10-20 µm. For infrared imaging detectors, larger thicknesses of readout wafer 11 may be permissible, because in this case absorber wafer 16 is as thin as, for example, 0.4-1.0 µm or even thinner. For infrared detectors, the thickness of readout wafer 11 may therefore be in the range from 20-50 µm or 50-100 µm or even larger than 100 µm. The Si region close to bonded interface 17 may furthermore comprise an avalanche region in which photo-carriers crossing the interface are multiplied for higher sensitivity (see, for example, Y. Kang et al. in Nature Photonics 3, 59 (2009), the entire disclosure of which is hereby incorporated by reference). Moreover, in this application, back contact 19 has to be transparent to infrared radiation.

In an aspect of the embodiment, the bonded sensor layer may be pixelated by post-bonding lithography and patterning steps known in the art.

In another aspect of the embodiment, the sensor layer is a pixelated epitaxial sensor fabricated by growing isolated epitaxial sensor crystals onto a Si substrate patterned, for example, in the form of tall Si pillars.

Referring now to FIG. 1B, second embodiment 20 of a monolithic pixel detector is incorporating a covalent bond 27 between lightly n-doped CMOS processed Si wafer 21 incorporating lightly p-doped layer 21' on its underside and nominally undoped (intrinsic) but p-conducting or lightly doped absorber wafer 26. Si wafer 21 preferably has a resistivity above about 500 Ωcm or 1-2 kΩcm or more preferably about 2-5 kΩcm or even above 5 kΩcm, for example, 5-50 kΩcm. Lightly p-doped layer 21' preferably has a resistivity in the same range. The doping of absorber wafer 26 should be chosen in order to yield the highest possible resistivity the semiconductor material from which it is made can have. For an intrinsic Ge absorber, the room temperature resistivity is about 50 Ωcm, the rather low value of which requires detectors incorporating this absorber to be cooled, for example, to liquid nitrogen temperature. Absorbers made from $Si_{1-x}Ge_x$ alloys may have substantially higher resistivities, depending on the Ge concentration x, such as, for example, about $6 \times 10^4$ Ωcm for x=0.75. Sensors made from Cr-doped GaAs may have an even larger resistivity of about $10^9$ Ωcm. Absorbers from CdTe have a similar resistivity, and those from CdZnTe alloys an even higher one. The figure shows a small part of the detector in cross-section, the width of which corresponds to slightly more than single pixel size which may range, for example, from 1-5, 5-20, 20-50, 50-100 or 100-200 µm, depending on the CMOS process used. In this configuration, n-well 25 serves as charge collector, collecting electrons coming from electron-hole pairs which are generated by photons incident on absorber wafer 26 and separated in the electric field of the p-n junction formed by lightly n-doped Si wafer 21 and lightly p-doped layer 21' on its underside. The distance between adjacent n-wells 25 defines the pixel size. In the example of FIG. 1B, the n-MOS and p-MOS transistors of the pixel electronics of the readout are situated in p-wells 22 and n-wells 23, respectively. Deep p-well 24 has the purpose of avoiding electron collection by n-wells 23 in addition to charge collecting n-well 25. In an aspect of the embodiment, part of the pixel electronics may be located in n-well 25. In the configuration of embodiment 20, the p-n junction 28 is not located at bonded interface 27. Here, p-n junction 28 is rather formed inside the readout wafer by lightly p-doped layer 21' and the lightly n-doped main part of wafer 21. Embodiment 20 can be realized, for example, by means of an SOI wafer incorporating a thin, lightly p-doped Si layer with a highly resistive n-doped layer on top, hosting the CMOS processed readout. Lightly p-doped layer 21' may, for example, have a thickness of about 1-2 µm or 2-5 µm. The substrate and box of the SOI wafer are thereby removed prior to forming covalent bond 27. When a reverse bias is applied to back contact 29, the space charge layer therefore expands from p-n junction 28 both into the n-doped region of Si wafer 21 and into p-doped layer 21' as well as p-conducting absorber 26 wafer.

In order to allow for efficient charge collection, readout wafer 21 should preferably be thin, such that in operation most or preferably all of the space charge region extends through both readout wafer 21, lightly doped layer 21' and absorber wafer 26. In other words, in operation, readout wafer 21 and absorber wafer 26 should preferably be fully depleted especially for the efficient detection of X-ray photons. The thickness of readout wafer 21, incorporating p-doped layer 21' is preferably kept below about 30 µm, or more preferably between about 5-25 µm, or even more preferably between about 10-20 µm. For infrared imaging detectors, larger thicknesses of readout wafer 21 may be permissible, because then, absorber wafer 26 is as thin as, for example, 0.4-1.0 µm or even thinner. For infrared detectors, the thickness of readout wafer 21 may therefore be in the range from 20-50 µm or 50-100 µm or even larger than 100 µm. The Si region close to bonded interface 27 may furthermore comprise an avalanche region in which photo-carriers crossing the interface are multiplied for higher sensitivity (see, for example, Y. Kang et al. in Nature Photonics 3, 59 (2009), the entire disclosure of which is hereby incorporated by reference). Moreover, in this application, back contact 29 has to be transparent to infrared radiation.

In an aspect of the embodiment, the bonded sensor layer may be pixelated by post-bonding lithography and patterning steps known in the art.

In another aspect of the embodiment, the sensor layer is a pixelated epitaxial sensor, fabricated by growing isolated epitaxial sensor crystals onto a Si substrate patterned, for example, in the form of tall Si pillars.

In yet another aspect of the embodiment, the p-n junction is located inside the absorber wafer rather than in the readout wafer. This may be realized easily, for example, by low-dose ion implantation (to keep resistivity high) or by doping during the epitaxial growth when the absorber wafer comprises an epitaxial absorption layer.

Referring now to FIG. 1C, third embodiment 30 of a monolithic pixel detector may comprise covalent bond 37 between lightly p-doped CMOS processed Si wafer 31, acting as readout wafer, and nominally undoped (intrinsic) but n-conducting or lightly n-doped absorber wafer 36. The figure shows a small part of the detector in cross-section, the width of which corresponds to slightly more than single pixel size which may range, for example, from 1-5, 5-20, 20-50, 50-100 or 100-200 µm, depending on the CMOS process used. In this configuration, suitable for hole collection, the doping of all implants is reversed with respect to that of FIGS. 1A and 1B. Hence, here, p-well 35 serves as charge collector, collecting holes generated by photons incident on absorber wafer 36. The distance between adjacent p-wells 35 defines the pixel size. In the example of FIG. 1C, the p-MOS and n-MOS transistors of the pixel electronics of the readout are situated in n-wells 32 and p-wells 33, respectively. Deep n-well 34 has the purpose of avoiding hole collection by p-wells 33 in addition to charge collecting p-well 35. In an aspect of the embodiment, part of the pixel electronics may be located in p-well 35. Lightly p-doped Si wafer 31 preferably has a resistivity above about 500 Ωcm or 1-2 kΩcm or more preferably about 2-5 kΩcm or even above 5 kΩcm, for example, 5-50 kΩcm. Lightly n-doped absorber wafer 36 should have the highest possible resistivity the semiconductor material from which it is made can have. Sensors made from Cr-doped GaAs may have a resistivity of about $10^9$ Ωcm. Absorbers from CdTe have a similar resistivity, and those from CdZnTe alloys an even higher one. In the configuration of embodiment 30, bonded interface 37 serves simultaneously as p-n junction 38 between lightly p-doped Si wafer 31 and n-conducting absorber wafer 36. When a reverse bias is applied to back contact 39, the space charge layer therefore expands from interface 37 both into wafer 31 and absorber 36.

In order to allow for efficient charge collection, readout wafer 31 should preferably be thin, such that most of the space charge region extends through both readout wafer 31 and absorber wafer 36. In operation, readout wafer 31 and absorber wafer 36 should preferably be fully depleted especially for the efficient detection of X-ray photons. The thickness of readout wafer 31 is preferably kept below about 30 µm, or more preferably between about 5-15 µm, or even more preferably between about 10-20 µm. For infrared imaging detectors, larger thicknesses of readout wafer 31 may be permissible, because then absorber wafer 36 is as thin as, for example, 0.4-1.0 µm or even thinner. For infrared detectors, the thickness of readout wafer 31 may therefore be in the range from 20-50 µm or 50-100 µm or even larger than 100 µm. The Si region close to bonded interface 37 may furthermore comprise an avalanche region in which photo-carriers crossing the interface are multiplied for higher sensitivity (see, for example, Y. Kang et al. in Nature Photonics 3, 59 (2009), the entire disclosure of which is hereby incorporated by reference). Moreover, in this application, back contact 39 has to be transparent to infrared radiation.

In an aspect of the embodiment, the bonded sensor layer may be pixelated by post-bonding lithography and patterning steps known in the art.

In another aspect of the embodiment, the sensor layer is a pixelated epitaxial sensor, fabricated by growing isolated epitaxial sensor crystals onto a Si substrate patterned, for example, in the form of tall Si pillars.

In yet another aspect of embodiment 30, the p-n junction may not be located at bonding interface 37 but rather inside the readout wafer, or, alternatively, in the absorber wafer if the latter comprises an epitaxial absorption layer, for example, on an SOI wafer.

In a further aspect of the embodiment, the p-n junction is located inside the absorber wafer rather than in the readout wafer. This may be realized easily, for example, by low-dose ion implantation (to keep resistivity high) or by doping during the epitaxial growth when the absorber wafer comprises an epitaxial absorption layer.

Referring now to FIG. 1D, embodiment 40 is a modified pixel detector structure which can both be operated with a forward and a reverse bias applied to back contact 39, 49. When p-n junction 38, 48 is located in bonded absorber wafer 36, 46 and polarized in the forward direction, the depletion region shrinks instead of expanding and current flows. In this mode of operation, absorber wafer 36, 46 is transformed into an emitter wafer provided that the latter is made from a crystalline material with suitable photoemitter properties. In other words, modified pixel detector structure of embodiment 40 may act as a display in which charge carriers recombine under photon emission instead of being generated under photon absorption, as happens in the detector mode prevailing under reverse bias conditions. In display mode, implants 35, 45 are current injectors rather than charge collectors which are controlled by the electronic circuits of CMOS processed wafer 31, 41 which now acts as a driver wafer controlling the injected current. Implants 35, 45 define the pixels of the display in a similar way as they define the detector pixels under reverse bias conditions of embodiments 30 and 40. For display applications, the doping level of thinned electronics wafer 31, 41 is preferably chosen higher than for detector applications in order to lower the series resistance, for example about $10^{17}$-$10^{18}$ cm$^{-3}$ or about $5\times10^{17}$-$5\times10^{18}$ cm$^{-3}$, corresponding to resistances of between about 0.2 Ωcm and 7 m Ωcm. It is furthermore advisable to use heavy p$^{++}$-doping for doped layer 41' of Si wafer 31, 41 and to include a heavily p$^{++}$-doped layer 51' in emitter wafer 36, 46. Heavily doped layers 41', 51' may lower the resistance across bonding interface 37, 47, improving current injection into emitter wafer 36, 46. In embodiment 40, emitter wafer 36, 46 is preferably a quantum well emitter, containing quantum wells 53 at p-n junction 38, 48 between p-doped layers 51 and n-doped layers 52. Emitter wafer 36, 46 may be based, for example, on GaN and AlGaN, InGaN and AlInGaN alloy layers which also form the basis of high efficiency LEDs for lighting purposes.

Embodiments 10, 20 may be similarly employed both in detector and in display mode by adjusting the doping levels of wafers 11, 21, optionally inserting highly n$^{++}$-doped layers on both sides of bonded interfaces 17, 27, providing absorber/emitter wafer 16, 26, for example, with a group III-nitride layer stack according to embodiment 40, and by appropriately choosing the bias applied to back contact 19, 29.

The invention provides significant advantages over conventional micro-LED arrays (see for example U.S. Pat. No. 6,410,940 to Hongxing Jiang et al., the entire disclosure of which is hereby incorporated by reference) because of its simplicity of monolithically integrating driver/readout electronics with emitter/absorber wafer in place of conventional hybrid approaches based on bump bonding (see, for example, J. Day et al. in Appl. Phys. Lett. 99, 031116 (2011), the entire disclosure of which is hereby incorporated by reference).

Referring now to FIG. 2, embodiment 100 of a process sequence for the fabrication of a CMOS processed readout for a monolithic pixel detector includes the following steps:

1. Providing wafer 110 with lower surface 111 and upper surface 112. Wafer 110 may, for example, be an epitaxial wafer incorporating a Si substrate with low-doped, high resistivity epitaxial layer 117. Alternatively, wafer 110 may be an SOI wafer incorporating substrate 113, box 114 with lower interface 115 and upper interface 116 and Si layer 117, which is a low-doped, high-resistivity layer. The thickness of Si layer 117 is preferably below about 30 μm and more preferably about 5-25 μm or even more preferably about 10-20 μm. Its resistivity should be above about 500 Ωcm, preferably at least 1-2 kΩcm or more preferably 2-5 kΩcm or even above 5 kΩcm, for example, 5-50 kΩcm. The bulk of Si layer 117 may be either n-conducting or p-conducting (electron conduction or hole conduction), depending on whether the low doping is of n-type or p-type. Si layer 117 may optionally contain thin layer 117' of opposite doping type and equally high resistivity close to interface 116 with oxide box 114. Optional thin layer 117' may, for example, have a thickness of about 1-2 μm or preferably 2-5 μm.

2. Subjecting Si layer 117 of wafer 110 to CMOS processing, thereby transforming wafer 110 into CMOS processed readout wafer 120. The CMOS processing of readout wafer 120 may transform Si layer 117 into processed Si layer 127 with implants for p-MOS transistors 121 and n-MOS transistors 122, along with implants 123 for charge collection, the doping sign and conduction type of which is the same as that of the bulk of Si layer 117, 127. Preferably, the doping of optional high resistivity layer 117' of opposite doping type to that of layer 117 remains unaffected by the CMOS processing, so that layer 127 optionally still contains layer 127' of opposite doping type. The spacing of adjacent implants 123 defines the pixel size. CMOS processed Si layer 127 also contains other circuit elements, as well as contact pads 124 for connecting the readout electronics to an external PCB for the communication with the outside world. Readout wafer 120 may comprise, for example, six or eight metallization layers and field oxide 125 as known in the art.

3. Planarizing readout wafer 120 by optionally providing additional oxide layer 131 on field oxide 125 and planarizing surface 132 of oxide layer 131, for example, in a chemical-mechanical planarization step as known in the art, giving rise to planarized readout wafer 130. Alternatively, layer 131 may be a polymer layer serving the purpose of planarizing the surface of readout wafer 120.

4. Providing planarized surface 132 of oxide layer 131 on readout wafer 130 particle-free and activating planarized surface 132, preferably by a plasma activation process known in the art to make it ready for oxide-to-oxide fusion bonding.

5. Providing carrier wafer 140 which is preferably an oxidized Si wafer 141 with oxide layer 142 or, alternatively, a fused quartz wafer (SiO$_2$). Rendering surface 143 of oxide layer 142 particle-free and activated, preferably by a plasma activation process known in the art to make it ready for oxide-to-oxide fusion bonding.

6. Providing bonded wafer stack 150 by fusion bonding of planarized, activated surface 132 of oxide layer 131 on readout wafer 130 onto activated oxide surface 143 of carrier wafer 140, thereby forming strong bond 151 between oxide layer 131 and oxide layer 142 in a low-temperature oxide-to-oxide fusion bonding process. Preferably, an oxide-to-oxide bond 151 is formed at room temperature and requires only a low-temperature anneal up to less than 300° C. to acquire full bonding strength (see, for example, T. Plach et al. in J. Appl. Phys. 113, 094905 (2013), the entire disclosure of which is hereby incorporated by reference). Fusion bonding is the preferred way of bonding the readout wafer to a carrier wafer because of high bonding strength and the vacuum compatibility of the bond required for subsequent covalent wafer bonding of readout and absorber wafers in a high-vacuum wafer bonding tool. Alternatively, if layer 131 is a planarizing polymer layer, wafer 130 and wafer 140 may be realized with the polymer layer acting as a glue hardening of which requires anneals to temperatures below 300° C.

7. Thinning readout wafer 130 of bonded readout wafer stack 150. For example, when wafer 110 is an SOI wafer thinning may comprise removing substrate 113 and box 114, for example, by grinding and spin or plasma etching or a combination of grinding, polishing and etching processes. Optionally, lower surface 166 of thinned bonded readout wafer stack 160 may be subjected to a chemical mechanical planarization (CMP) step, ensuring a surface roughness of about 0.2-0.4 nm, low enough for covalent wafer bonding, followed by the removal of any particulate contamination. Si layer 127 may thereby be slightly reduced in thickness to Si layer 167. The thickness reduction should, however, be sufficiently small, for example, below 1 μm, in order not to remove optional layer 127' thinned to layer 167', because when present, it is doped oppositely to the main body of layer 167. The presence of optional doped layer 167' ensures that the p-n junction is located at the interface between layers 167 and layer 167' rather than at the bonding interface when readout wafer stack 160 is covalently bonded to a sensor wafer. Optionally, Si layer 167 may be subjected to a shallow hydrogen implant in order to facilitate the passivation of interface states arising in the subsequent covalent wafer bonding step. With this preparation, bonded wafer stack 160, incorporating a stable oxide-to-oxide bond between oxide layer 142 of carrier wafer 140 and oxide layer 131 of the thinned readout wafer 165, is now ready for covalent wafer bonding.

Figure 3:
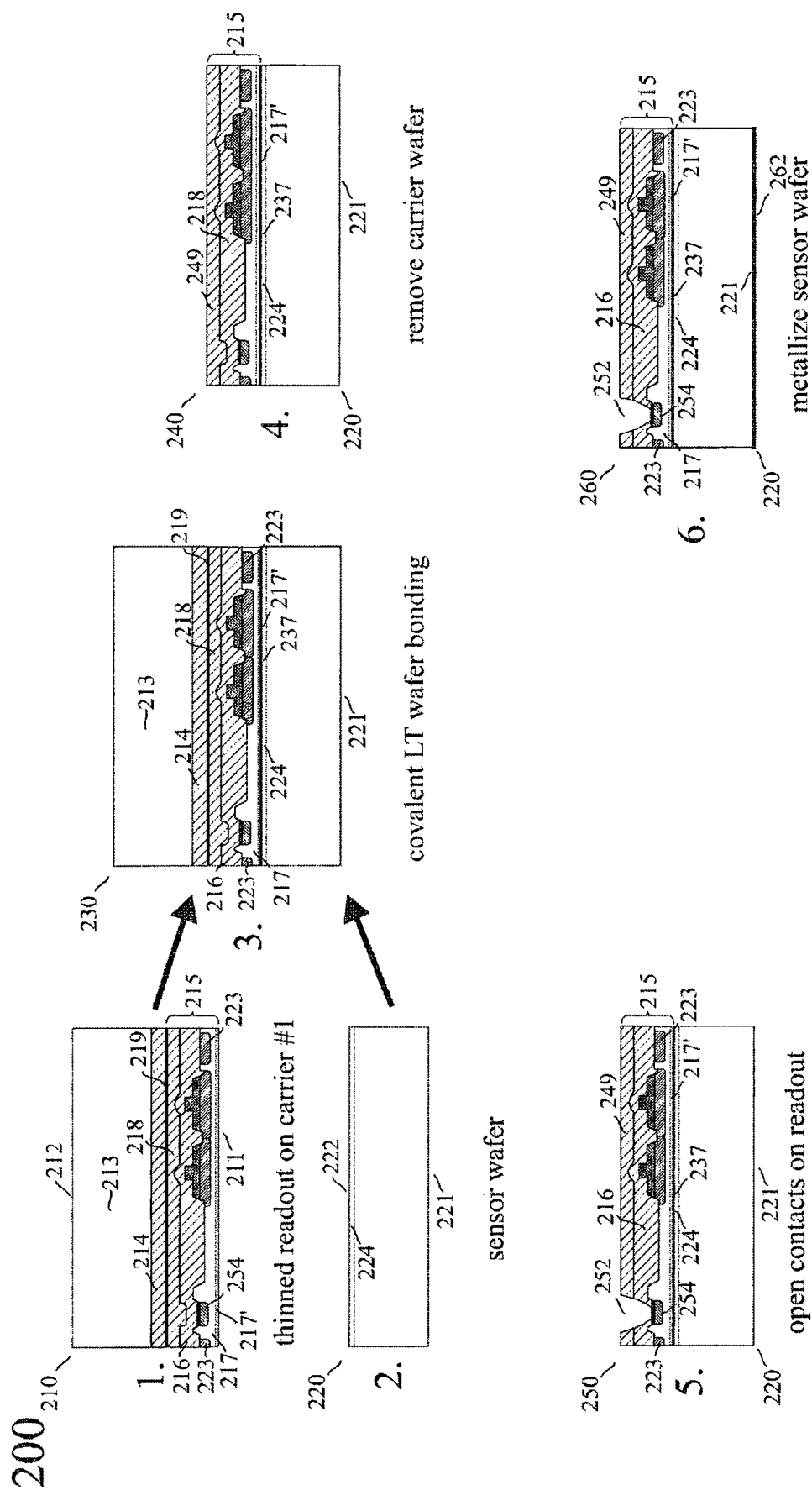
FIG. 3 is a schematic diagram of the process flow for covalent bonding of a thinned CMOS processed readout wafer onto an absorber wafer.

Referring now to FIG. 3, embodiment 200 of a process sequence for the fabrication of a monolithic pixel detector incorporating a covalent bond between CMOS processed readout and sensor wafer contains the following steps:

1. Providing bonded wafer stack 210 with lower surface 211 and upper surface 212, wafer stack 210 incorporating thinned readout wafer 215 bonded to carrier wafer 213, wherein the readout is processed in first Si layer 217 of a first doping type equal to that of charge collection implants 223. Lower surface 211 of bonded wafer stack 210 should be flat and smooth with a surface roughness preferably on the order of 0.2-0.4 nm, in any case low enough for covalent wafer bonding. Lower surface 211 may furthermore optionally comprise a shallow hydrogen implant at a depth of, for example, 10-100 nm, the hydrogen providing possible passivation of defects after the covalent bonding of step 3. Readout wafer 215 may comprise numerous additional circuit elements along with contact pads 254 for electrical connections to an external PCB communicating with the outside world. The Si substrate of readout wafer 215 may optionally comprise a second Si layer 217' of a second, opposite doping type. First Si layer 217 is preferably a low doped, high resistivity layer with a resistivity above about 500 Ωcm, preferably at least 1-2 kΩcm or more preferably 2-5 kΩcm or even above 5 kΩcm, for example, 5-50 kΩcm. The thickness of first and second Si layer 217, 217' together is preferably below about 30 µm and more preferably about 5-25 µm or even more preferably about 10-20 µm. Optional second Si layer 217' preferably has a resistivity in the same range and may be about 1-2 µm or preferably 2-5 µm thick. In the presence of second Si layer 217' the p-n junction of the pixel detector is located inside readout wafer 215. Thinned readout wafer 215 is bonded to a carrier wafer, the carrier wafer preferably, for example, consisting of oxidized Si wafer 213 with oxide layer 214 or a fused quartz wafer ($SiO_2$). Readout and carrier wafers are preferably bonded in a strong oxide-to-oxide bond at interface 219 between oxide 214 of the carrier wafer and planarized oxide layer 218 on CMOS processed readout wafer 215. Alternatively, readout and carrier wafers may be bonded by means of a polymer bond.

2. Providing sensor (absorber) wafer 220 with lower surface 221 and upper surface 222 and conduction type opposite to that of charge collection implants 223 of readout wafer 215. Upper surface 222 of absorber wafer 220 should be flat and smooth with a surface roughness preferably on the order of 0.2-0.4 nm, in any case low enough for covalent wafer bonding. Upper surface 222 may furthermore optionally comprise a shallow hydrogen implant at a depth of, for example, 10-100 nm, the hydrogen providing possible passivation of defects after the covalent bonding of step 3. Sensor wafer 220 should have the highest resistivity the semiconductor material from which it is made can possibly have. For an intrinsic Ge absorber, the room temperature resistivity is about 50 Ωcm, the rather low value of which requires detectors incorporating this absorber to be cooled, for example, to liquid nitrogen temperature. Absorbers made from $Si_{1-x}Ge_x$ alloys may have substantially higher resistivity, depending on the Ge concentration x, such as, for example, about $6\times10^4$ Ωcm for x=0.75. Sensors made from Cr-doped GaAs may have an even larger resistivity of about $10^9$ Ωcm. Absorbers from CdTe have a similar resistivity, and those from CdZnTe alloys an even higher one. Unless optional second Si layer 217' is present, absorber wafer 220 may optionally be incorporating, at least in part, thin layer 224 close to upper surface 222 of doping type similar to that of charge collection implants 223. Optional thin layer 224 should thereby have a resistivity in a range comparable to that the bulk of wafer 220. Its thickness may, for example, be in a range of 2-10 µm in case that pixel detector 260 is used as an X-ray detector. In the presence of layer 224, the p-n junction of pixel detector 260 is located within absorber wafer 220.

3. Activating surface 211 of readout wafer 215 and surface 222 of sensor wafer 220, for example, by a HF dip or by plasma activation or a combination of the two, thereby rendering both surfaces oxide- and damage-free, and providing wafer stack 230 by forming low-temperature covalent bond 237 between readout and sensor wafers. Covalent bond 237 is preferably formed at room temperature and may be subjected to optional annealing at temperatures below 450° C. Preferably, annealing temperatures are kept below 400° C., and even more preferably below 350° C., such as, for example, 200-300° C. The optional annealing of covalent wafer bond 237 may have the added benefit of helping optionally implanted hydrogen to diffuse to the bonded interface and passivate interface states such as dangling bonds, thereby reducing or eliminate any interfacial barrier potentially blocking charge transport across that interface.

4. Providing covalently bonded wafer stack 240 by removing the carrier wafer from the readout wafer 215, for example, by grinding and spin etching or plasma etching or a combination of grinding, polishing and etching processes. Oxide layer 214 may thereby act as an etch stop before bonding interface 219 is reached.

5. Providing wafer stack 250 by exposing electrical contacts 254 defined by photolithography on oxide layer 249 of readout wafer 215 by etching holes 252 through oxide layers 249, 216, for example, in a plasma etching step. Contact holes 252 may subsequently be filled with metal for easier contacting, for example, by ball point bonding providing electrical contacts to a printed circuit board.

6. Completing monolithic pixel detector 260 by providing surface 221 of absorber wafer 220 with metallic back contact 262 for biasing the p-n junction between readout wafer 215 and sensor wafer 220 into depletion according to FIGS. 1A-1C.

In an aspect of embodiment 200 carrier wafer 213 may be only partially removed or not at all in step 4. Having part or all of wafer 213 continue to act as a mechanical support may be advantageous in particular when sensor wafer 220 consists of brittle material or when it is subjected to a thinning step before back contact 262 is formed. Thinning bonded absorber 220 may be required, for example, when monolithic pixel detector 260 is used for imaging with electromagnetic radiation in the near infrared. A Ge layer with a thickness in the range of 0.5-1 µm or even 0.2-0.5 µm is, for example, sufficient for the wavelength region of about 1-1.5 µm. A bonded Ge wafer can be thinned to this thickness range, for example, by grinding or plasma etching, and chemical mechanical planarization, or by a layer transfer technique as known in the art (see, for example, I. P. Ferain et al. in J. Appl. Phys. 107, 054315 (2010), the entire disclosure of which is hereby incorporated by reference).

Figure 4:
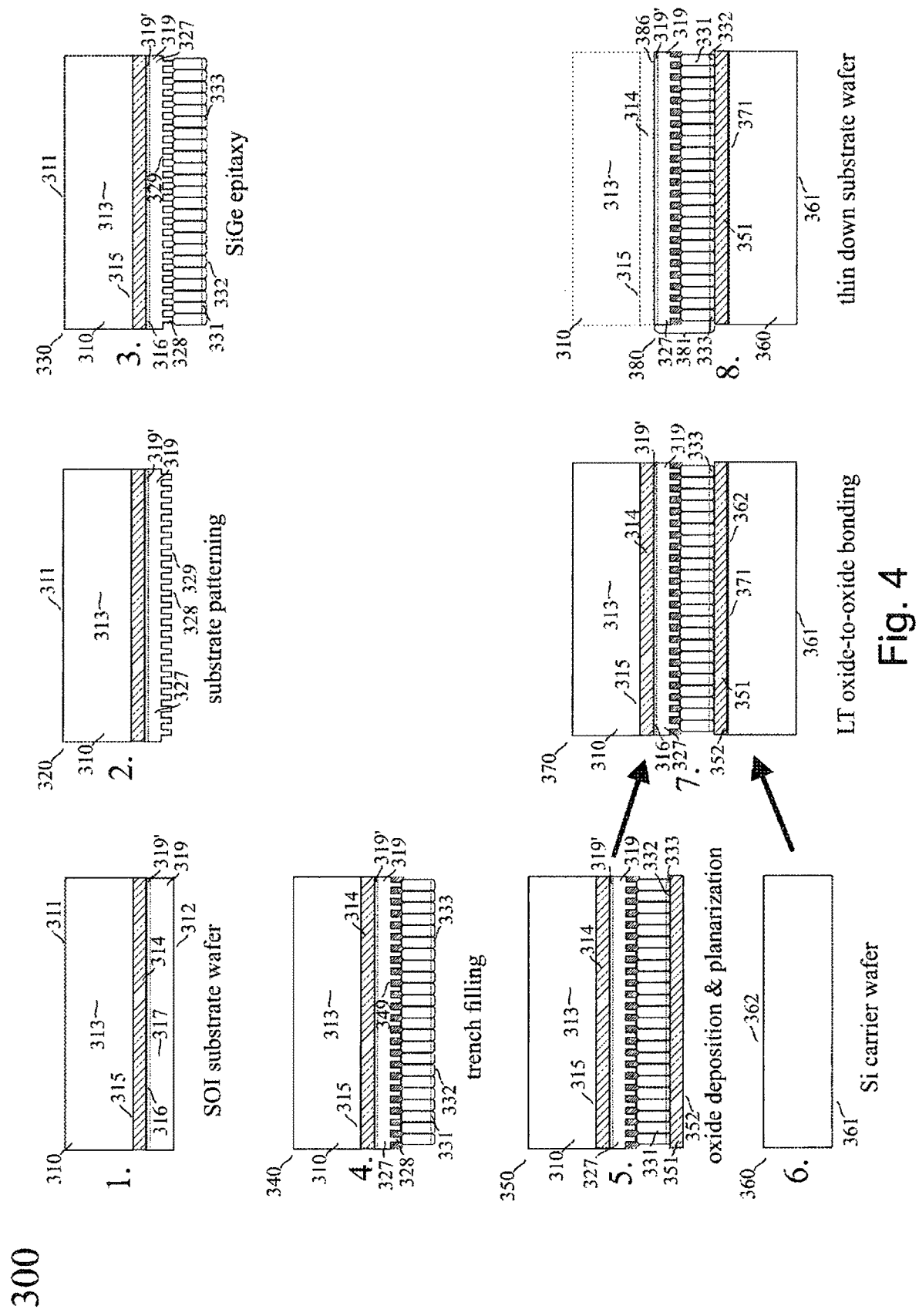
FIG. 4 is a schematic diagram of the process flow for fabrication of a pixelated absorber on a thinned substrate.
Figure 5:
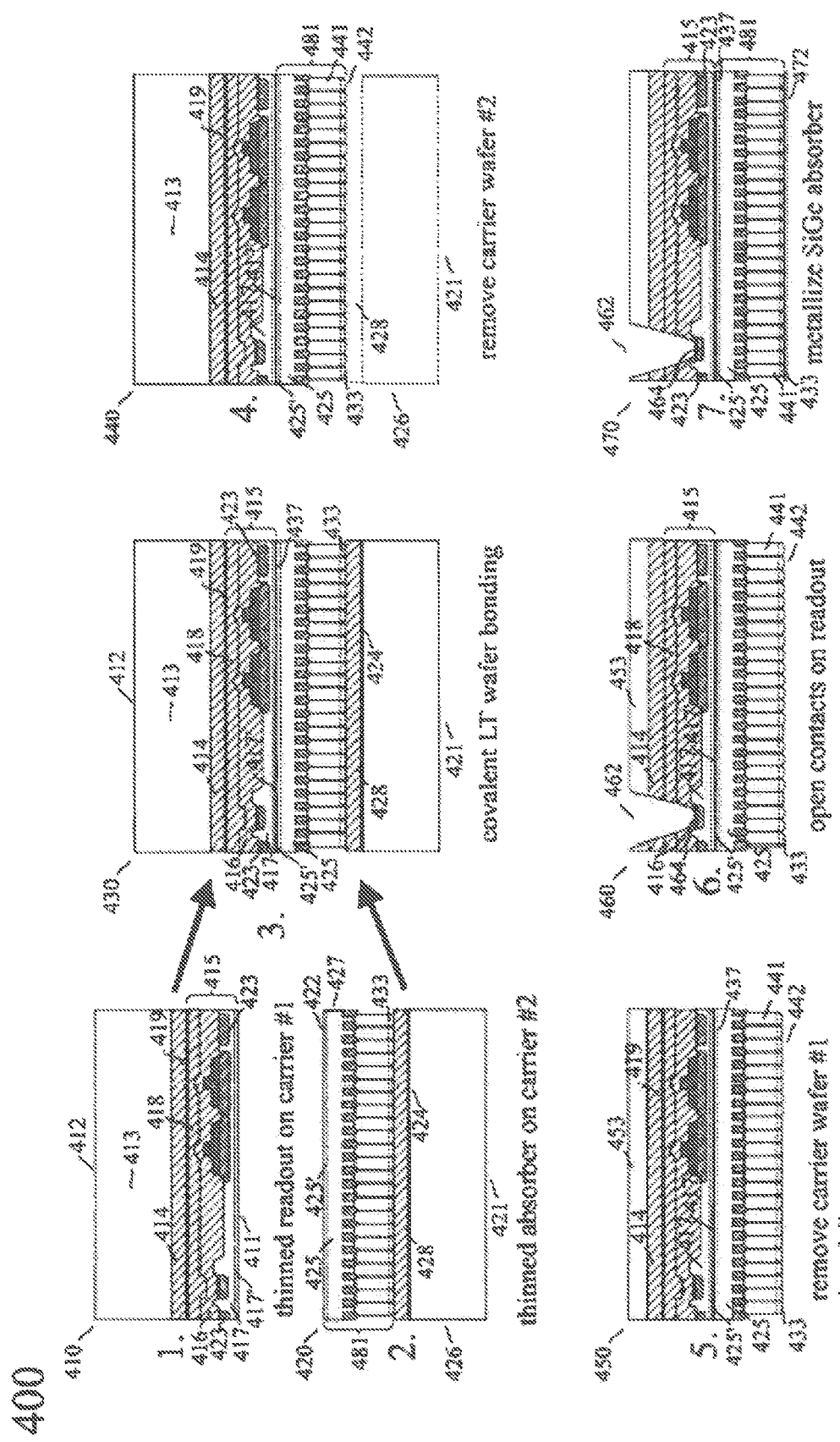
FIG. 5 is a schematic diagram of the process flow for bonding a thinned CMOS processed readout wafer to the thinned substrate of an epitaxial absorber wafer.

Referring now to FIG. 4, embodiment 300 of a process sequence for the fabrication of an absorber wafer incorporating an epitaxial absorption layer suitable in particular for X-ray detection may comprise the following steps:

1. Providing substrate wafer 310 having surface 311 and opposing surface 312. Substrate 310 may be a high resistivity Si wafer or preferably a SOI wafer incorporating Si substrate 313, oxide box 314 and Si layer 317 forming the Si substrate for the epitaxial absorption layer. Note that SOI wafer 310 is drawn upside down for reasons which will become clear below. Preferably, substrate Si layer 317 has a thickness in the range of 10-30 µm, with a range of 15-20 µm being the most preferable. The doping of Si layer 317 should be low, corresponding to a resistivity of at least 1-2 kΩcm or preferably at least 2-5 kΩcm or even more preferably above 5 kΩcm, for example, 5-50 kΩcm. If doped uniformly, the doping of Si layer 317 is preferably of the same sign to the doping type of the epitaxial absorption layer. For example, for the preferred case of a lightly p-doped SiGe absorption layer also Si substrate layer 317 should be lightly p-doped. Alternatively, layer 317 may optionally consist of two lightly doped sub-layers 319, 319' of opposite doping type. The doping type of optional sub-layer 319 adjacent to surface 312 should preferably be the same as that of the epitaxial absorption layer and the sub-layer should have a thickness of about 8-12 µm, while optional sub-layer 319' should be about 2-8 µm thick. The doping of sub-layers 319, 319' should be equally low, giving rise to a resistivity for both of at least 1-2 kΩcm or preferably at least 2-5 kΩcm or even more preferably above 5 kΩcm, for example, 5-50 kΩcm. In the presence of sub-layer 319' layer 117, 127, 167 of the readout wafer is preferably uniformly doped with the same doping type as that of sub-layer 319' while layer 117', 127', 167' is lacking. For such a doping sequence the p-n junction is located in the absorber wafer 481 after the formation of covalent bond 437 (FIG. 5). On the other hand, if sub-layers 319, 319' are lacking and layer 317 is uniformly doped, the p-n junction is located at the bonding interface after the formation of covalent bond 437.

2. Providing substrate wafer 320 with patterned Si layer 327 by patterning layer 317, for example, in the form of pillars 328 and trenches 329 by photolithography and reactive ion etching as known in the art. The width of Si pillars 328 may range within about 1-100 µm, with a range of about 2-20 µm being the most preferable. The width of trenches 329 may range between 2 µm and 6 µm, or preferably about 3-5 µm. The height of Si pillars 328 may range between about 2-10 µm, and preferably about 5-8 µm. Damage induced by the reactive ion etching process on the sidewalls of Si pillars 328 may be removed, for example, in an oxidation step, by means of which the sidewalls may in addition be passivated. Surface cleaning by methods known in the art may then render patterned Si layer 327 epi-ready.

3. Providing epitaxial absorber wafer 330 by epitaxially growing absorption layer 331 onto Si pillars 328 of epi-ready patterned Si layer 327. Preferably, the absorption layer is pixelated by being grown in the form of high resistivity absorber crystals 331 with surfaces 332 separated by narrow trenches. In this way, a thermal mismatch between the absorption layer and patterned Si layer 327 cannot induce any layer cracks. Preferably, the material of the absorption layer is a SiGe alloy with a high Ge content within about 20-80%, and even more preferably within about 70-80%. Alloy layers with a composition up to about 80% have a Si-like band structure with a larger band gap than pure Ge which is expected to reduce the leakage currents of an X-ray pixel detector (see, for example, J. Weber et al. in Phys. Rev. B 40, 5683-5693 (1989), the entire disclosure of which is hereby incorporated by reference). In a preferred aspect of the embodiment the SiGe absorption layer is a 100-300 µm thick highly resistive, p-conducting layer, for example, with a resistivity of about $6 \times 10^4$ Ωcm for a Ge content of 75%. Optionally, p-type conductance may be ensured by adding trace amounts, for example, of boron dopants during the epitaxial growth. In one aspect of the embodiment the SiGe absorption layer is compositionally graded preferably linearly with a low grading rate of about 1-2% up to the maximum Ge content, and extended in thickness at this final Ge content thereafter. This has been found to be useful in avoiding misfit dislocations to nucleate at the interface with patterned Si layer 327 (see, for example, International Patent Application No. WO 2016/097850 to von Känel, the entire disclosure of which is hereby incorporated by reference). High resistivity absorber crystals 331 may optionally be capped with doped layer 333, for example, with a thickness in the range of 1-5 µm. Depending on the way in which the absorber wafer is incorporated in a covalently bonded pixel detector, layer 333 may either be a low resistivity, highly p-doped cap layer facilitating ohmic behaviour of back contact 472 as in embodiment 400, or a high resistivity n-doped layer providing the p-n junction for carrier separation inside the absorber wafer as in embodiment 500.

4. Providing epitaxial absorber wafer 340 wherein trenches between Si pillars 328 and trenches separating crystals 331 are filled with filling material 349. The filling of trenches may provide better mechanical stability to the absorber structure for the subsequent process steps incorporating carrier wafer bonding, substrate thinning and covalent bonding to a readout wafer. The filling may preferably be carried out by atomic layer deposition (ALD) steps known in the art. The filling material may, for example, be $SiO_2$ or $Al_2O_3$ or a combination of the two.

5. Providing epitaxial absorber wafer 350, incorporating additional oxide layer 351 on surface 332 of epitaxial crystals 331. Oxide layer 351 may be deposited, for example, by plasma enhanced chemical vapour deposition (PECVD) and undergo a planarization step, for example, by chemical mechanical planarization (CMP). Planarized oxide layer 351 is furthermore rendered particle-free and its surface 352 activated, for example, in a plasma activation step known in the art to make it ready for oxide-to-oxide fusion bonding (see, for example, T. Plach et al. in J. Appl. Phys. 113, 094905 (2013), the entire disclosure of which is hereby incorporated by reference).

6. Providing carrier wafer 360 which may, for example, be an oxidized Si wafer with lower surface 361 and upper surface 362. Upper surface 362 of carrier wafer 360 is rendered particle-free and activated, for example, in a plasma activation step to make it ready for oxide-to-oxide fusion bonding (see, for example, T. Plach et al. in J. Appl. Phys. 113, 094905 (2013), the entire disclosure of which is hereby incorporated by reference).

7. Providing bonded wafer stack 370 incorporating strong low-temperature oxide-to-oxide wafer bond 371 between oxide surface 352 of the absorber wafer and oxidized surface 362 of the carrier wafer.

8. Providing bonded sensor wafer stack 380 incorporating thinned absorber wafer 381 bonded to carrier wafer 360 by oxide-to-oxide wafer bond 371 by thinning substrate wafer 310 to a thickness of about 10-30 µm, or preferably about 15-20 µm, or, if wafer 310 is a SOI wafer, by removing Si substrate 313 and box 314 of SOI wafer 310, for example, by grinding and spin or a combination of grinding, polishing and etching processes. Surface 386 of the thinned Si wafer may in addition undergo a chemical mechanical planarization step to make it flat and smooth with a surface roughness of, for example, 0.2-0.4 nm, low enough for covalent wafer bonding, and a cleaning step to render it particle-free for subsequent covalent bonding to the thinned readout wafer.

Referring now to FIG. 5, a first embodiment 400 of a process sequence for the fabrication of a monolithic pixel detector incorporating a covalent bond between a thinned readout wafer and an absorber wafer with an epitaxial absorption layer may comprise the following steps:

1. Providing readout wafer stack 410 incorporating thinned readout wafer 415 bonded to a first carrier wafer preferably consisting of oxidized Si wafer 413 with oxide layer 414. Oxide layer 414 of the carrier wafer is, for example, bonded to planarized oxide layer 418 of readout wafer 415 in stable oxide-to-oxide bond 419. Alternatively, bond 419 may be a polymer bond if carrier wafer 413 and readout wafer 415 are bonded by means of an intermediate polymer layer. Lower surface 411 of readout wafer stack 410 is the planarized, particle-free surface of thinned Si layer 417 incorporating the CMOS processed readout electronics. Lower surface 411 is flat and smooth with a surface roughness of about 0.2-0.4 nm, low enough for covalent wafer bonding. Upper surface 412 of readout wafer stack 410 is a surface of the first carrier wafer. The Si layer 117, 127, 167, 417 containing the readout electronics 165, 215, 415 may optionally comprise an additional thin layer of opposite doping type 117', 127', 167', 417' whereas the doping type of layer 117, 127, 167, 417 containing charge collector implants 123, 423 is preferably of the same type as that of implants 123, 423. Layer thicknesses and doping levels of thinned readout wafer 415 are preferably similar to those of embodiments 100 and 200.

2. Providing sensor wafer stack 380, 420 incorporating thinned absorber wafer 381, 481 bonded to a second carrier wafer preferably consisting of oxidized Si wafer 360, 426 bonded to planarized oxide layer 351, 428 on absorber wafer 381, 481 in stable oxide-to-oxide bond 371, 424. Absorber wafer 381, 481 preferably comprises an absorption layer made from separated epitaxial absorber crystals 331, 441 on patterned Si substrate 327, 427. Sensor wafer stack 380, 420 has lower surface 361, 421 which is a surface of the second carrier wafer. Upper surface 386, 422 of sensor wafer stack 380, 420 is the planarized, particle-free surface of thinned absorber wafer 381, 481 with a surface roughness of about 0.2-0.4 nm, low enough for covalent wafer bonding. The substrate Si layer 427 of absorber wafer 381, 481 may optionally comprise two sub-layers 319, 319'; 425, 425' of opposite doping or conduction type. Sub-layer 319, 425 adjacent to absorber layer 331, 441 preferably is of the same conduction type as absorber layer 331, 441, while sub-layer 319',425' preferably is of the same conduction type as that of Si layer 117, 127, 167, 417 incorporating the CMOS processed readout unit. If readout wafer 415 does comprise optional sub-layers 117', 127', 167', 417' with a doping type opposite to that of charge collector implants 123, 423, then Si layer 317, 327, 427 forming the substrate for epitaxial absorption layer 331, 441 is preferably uniformly doped with the same doping type as that of sub-layers 117', 127', 167', 417'. For this doping sequence the p-n junction responsible for electron-hole separation during detector operation is then located in readout wafer 165, 415. If on the other hand the Si layer incorporating the readout electronics does not comprise any additional layer of opposite doping type, while the Si substrate 317, 327, 427 of absorption layer 331, 441 does comprise sub-layers 319, 319'; 425, 425' of opposite doping type, then the p-n junction responsible for electron-hole separation during detector operation is located in absorber wafer 381, 481. If neither the Si layer containing the CMOS electronics 215, 415 nor the absorber wafer 381, 481 contains any sub-layers of opposite doping type, then the p-n junction responsible for electron-hole separation during detector operation is located at the covalently bonded interface 237, 437 under the condition that Si substrate layer 317, 327 and absorption layer 331, 441 are of the same doping type, opposite to that of the Si layer containing the CMOS processed readout electronics. Thicknesses and doping levels of sub-layers 425, 425' are preferably similar to those of sub-layers 319, 319' of embodiment 300. Similar to embodiment 300 absorber layer 441 is preferably a SiGe alloy with a high Ge content within about 20-80%, and even more preferably within about 70-80%. The same applies to the resistivity of the SiGe absorber layer which preferably is a highly resistive, p-conducting layer, for example, with a resistivity of about $6 \times 10^4$ Ωcm for a Ge content of 75%. Moreover, it may be advantageous for the SiGe absorber layer to be compositionally graded with a low grading rate of about 1-2% up to the maximum Ge content in order to avoid misfit dislocations to nucleate at the interface with patterned Si layer 327. Epitaxial absorber crystals 331, 441 may optionally be capped with highly p-doped, for example, 1-2 μm thick cap 333, 433 in order to facilitate ohmic contact formation in step 7.

3. Activating surface 166, 411 of readout wafer stack 160, 410 and surface 386, 422 of sensor wafer stack 380, 420, for example, by a HF dip or by plasma activation or a combination of the two, thereby rendering both surfaces oxide- and damage-free, and ready for covalent wafer bonding, and providing wafer stack 430 by forming low-temperature covalent bond 437 between readout and sensor wafer stacks. Covalent bond 437 is preferably formed at room temperature and may be subjected to optional annealing at temperatures below 450° C. Preferably, annealing temperatures are kept below 400° C., and even more preferably below 350° C., such as, for example, 200-300° C.

4. Providing wafer stack 440 by removing second carrier wafer 360, 426 from thinned absorber wafer 381, 481, for example, by grinding and spin etching or plasma etching or a combination of grinding, polishing and etching processes. Oxide layer 351, 428 on absorber layer 331, 441 may thereby act as an etch stop which is subsequently removed, for example, by another plasma etching step to expose surface 332, 442 of absorber layer 331, 441.

5. Providing thinned bonded wafer stack 450 by partially or completely removing first carrier wafer 413, for example, by grinding and spin etching or plasma etching or a combination of grinding, polishing and etching processes. Optionally keeping, for example, 100-200 μm thick part 453 of carrier wafer 413 may be beneficial for the mechanical stability of the detector structure.

6. Exposing electrical contact pads 464 on readout wafer 415 by etching holes 462 through optional Si layer 453 and oxide layers 414, 416 and 418, for example, in a series of plasma etching steps. Contact holes 462 may subsequently be filled with metal for easier contacting, for example, by ball point bonding providing electrical contacts to a printed circuit board.

7. Completing monolithic pixel detector 470 by providing surface 442 of absorber layer 441 of absorber wafer 481 with metallic back contact 472 for biasing the p-n junction between readout wafer 415 and sensor wafer 481 into depletion according to FIGS. 1A-1C.

Figure 6:
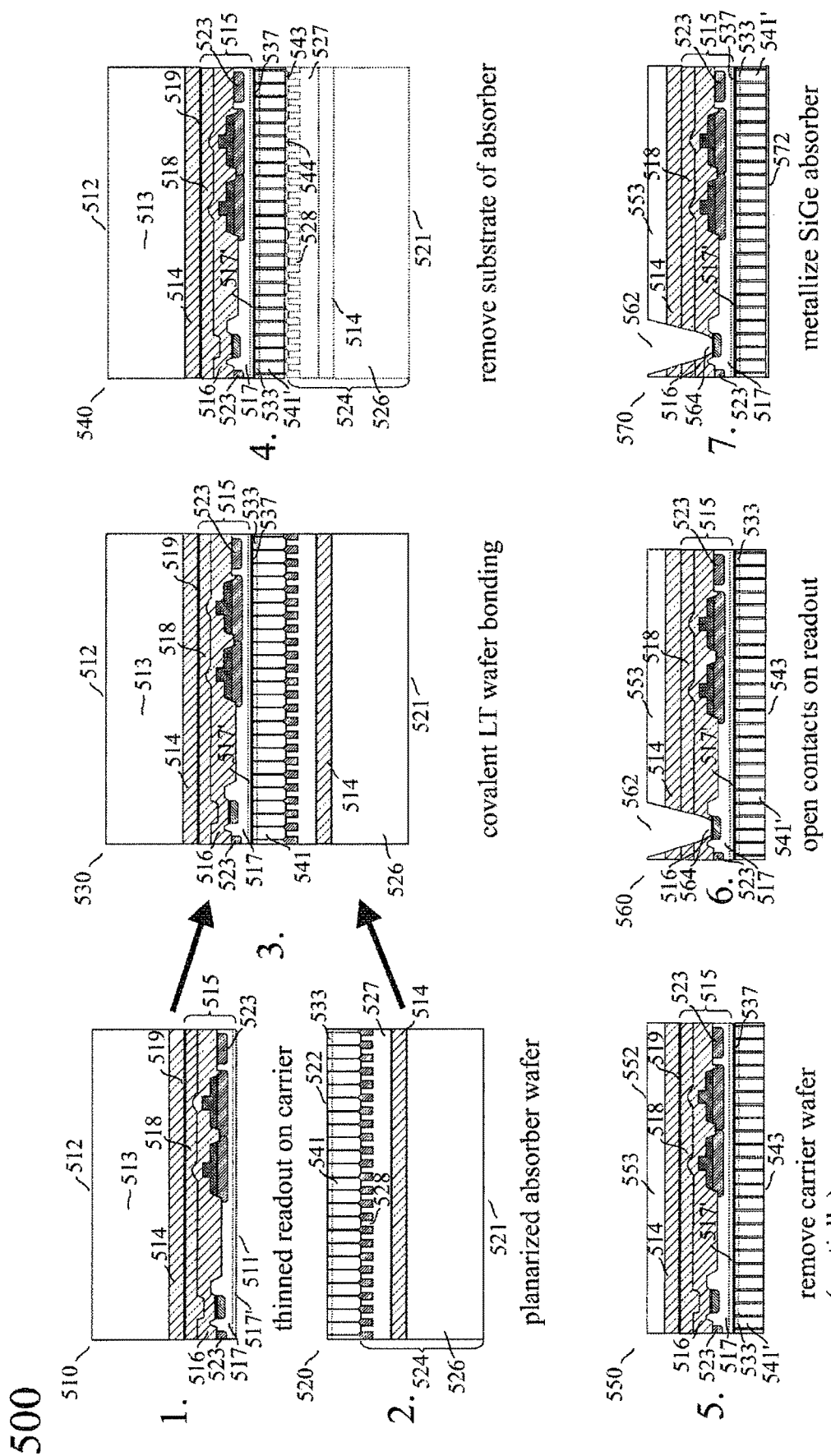
FIG. 6 is a schematic diagram for the process flow for bonding a thinned CMOS processed readout wafer to the epitaxial layer of an epitaxial absorber wafer.

Referring now to FIG. 6, a second embodiment 500 of a process sequence for the fabrication of a monolithic pixel detector incorporating a covalent bond between a thinned readout wafer and an absorber wafer with an epitaxial absorption layer may comprise the following steps:

1. Providing readout wafer stack 510 incorporating thinned readout wafer 515 bonded to a carrier wafer preferably consisting of oxidized Si wafer 513 with oxide layer 514. Oxide layer 514 of the carrier wafer is, for example, bonded to planarized oxide layer 518 of readout wafer 515 in stable oxide-to-oxide bond 519. Alternatively, bond 519 may be a polymer bond if carrier wafer 513 and readout wafer 515 are bonded by means of an intermediate polymer layer. Lower surface 511 of readout wafer stack 510 is 2. planarized, particle-free surface of thinned Si layer 517 incorporating the CMOS processed readout electronics. Lower surface 511 is planarized, for example, in a chemical mechanical planarization step providing a surface roughness of about 0.2-0.4 nm low enough for covalent wafer bonding. Upper surface 512 of readout wafer stack 510 is a surface of the carrier wafer. The Si layer 117, 127, 167, 417, 517 containing the readout electronics 165, 215, 415, 515 may optionally comprise an additional thin layer of opposite doping type 117', 127', 167', 417', 517' whereas the doping type of layer 117, 127, 167, 417, 517 containing charge collector implants 123, 423, 523 is preferably of the same type as that of implants 123, 423, 523 themselves. Layer thicknesses and doping levels of thinned readout wafer 515 are preferably similar to those of embodiments 100, 200 and 400.

3. Providing sensor wafer 520 with lower surface 521 and upper surface 522. Sensor wafer 520 comprises an epitaxial layer preferably in the form of separated, high resistivity absorber crystals 541 on Si substrate 524 patterned in the form of Si pillars 528. Si substrate 524 may be a SOI wafer with substrate 526, oxide box 514 and Si layer 527. Alternatively, Si substrate 524 may be a standard Si wafer patterned in the form of Si pillars. In both cases the dimensions (width, separation and depth) of the Si patterns are given in embodiment 300. In contrast to embodiment 400 Si substrate 524 does not require to have any specific doping type or doping level. Upper surface 522 of sensor wafer 520 is a particle-free surface planarized, for example, in a chemical mechanical planarization step in order to be flat and smooth with a surface roughness of about 0.2-0.4 nm low enough for covalent wafer bonding. Similar to embodiments 300, 400 absorber layer 541 is preferably a SiGe alloy with a high Ge content within about 20-80%, and even more preferably within about 70-80%. The same applies to the resistivity of the SiGe absorber layer which preferably is a highly resistive, p-conducting layer, for example, with a resistivity of about $6\times10^4$ Ωcm for a Ge content of 75%. Absorber crystals 541 may optionally be capped with high resistivity, for example, 2-5 μm thick n-doped cap 533, providing the p-n junction within the absorber layer in case that Si layer 517 of readout wafer 510 is uniformly doped, i.e. when thin layer 517' is absent.

4. Activating surface 166, 411, 511 of readout wafer stack 160, 410, 510 and surface 522 of sensor wafer 520, for example, by a HF dip or by plasma activation or a combination of the two, thereby rendering both surfaces oxide- and damage-free, and ready for covalent wafer bonding, and providing wafer stack 530 by forming low-temperature covalent bond 537 between readout wafer stack 510 and sensor wafer 520. Covalent bond 537 is preferably formed at room temperature and may be subjected to optional annealing at temperatures below 450° C. Preferably, annealing temperatures are kept below 400° C., and even more preferably below 350° C., such as, for example, 200-300° C.

5. Providing wafer stack 540 by removing substrate 524 of absorber wafer 520, for example, by grinding and spin etching or plasma etching or a combination of grinding, polishing and etching processes. If substrate 524 is a SOI wafer, oxide layer 514 may act as a partial etch stop before Si layer 527 is also removed. In a preferred aspect of the embodiment, lower part 544 of epitaxial crystals 541 adjacent to substrate pillars 528 is removed as well, giving rise to an absorber wafer composed of somewhat shorter absorber crystals 541' with surface 543. Removing several μm of lower part 544 of epitaxial crystals 541, such as, for example, 2-5 μm, has the advantage of eliminating the misfit related crystal defects which are always present at the SiGe/Si interface unless the SiGe alloy is graded at a very low grading rate.

6. Providing thinned bonded wafer stack 550 by partially or completely removing carrier wafer 513, for example, by grinding and spin etching or plasma etching or a combination of grinding, polishing and etching processes. Optionally keeping, for example, 100-200 μm thick part 553 of carrier wafer 513 may be beneficial for the mechanical stability of the detector structure.

7. Exposing electrical contact pads 564 on readout wafer 515 by etching holes 562 through optional Si layer 553 and oxide layers 514, 516 and 518, for example, in a series of plasma etching steps. Contact holes 562 may subsequently be filled with metal for easier contacting, for example, by ball point bonding providing electrical contacts to a printed circuit board.

8. Completing monolithic pixel detector 570 by providing surface 543 of the absorber wafer composed of pixelated absorber layer 541' with metallic back contact 572 for biasing the p-n junction between readout wafer 515 and sensor layer 541' into depletion according to FIGS. 1A-1C.

Exemplary Applications of the Electromagnetic Radiation Detector in Medical, Industrial and Scientific Systems and Methods The pixel detector of the present invention is integrated into and used in methods of the following medical, industrial and other applications as described below.

Near-Infrared Detection Example

The pixel detector of the invention is used in a CMOS integrated imaging system with Ge sensors for short wavelength infrared radiation, preferably in the wavelength range of about 1-1.6 μm. The detector is equally sensitive for shorter wavelengths reaching into the visible range of the electromagnetic spectrum. In contrast to methods employing epitaxial Ge growth on Si substrates, the Ge absorption layer of the invention contains no extended defects, such as threading dislocations and stacking faults (see, for example, L. Colace et al. in IEEE Photonics Technology Letters 19, 1813-1815 (2007), the entire disclosure of which is hereby incorporated by reference). Because the bonding steps of the invention are all carried out at or near room temperature, they can be fully executed in back end processes in contrast to epitaxial growth methods which require high substrate temperatures (see, for example, C. S. Rafferty et al. in Proc. of SPIE 6940, 69400N (2008), and I. Aberg I. et al. in IEDM 2010, pp. 344, the entire disclosures of which are hereby incorporated by reference). According to their construction, the pixel detectors of the invention are characterized by a fill-factor of 100%. The pixel size can be chosen in a wide range from about $2\times2$ μm$^2$ to $20\times20$ μm$^2$ or larger, whatever are the requirements of the specific application. Sensor thicknesses can likewise be chosen in accordance with the wavelength range to be detected. For example, for a wavelength of 1.55 μm, a thickness of 15 μm may be required to absorb 50% of the radiation penetrating the sensor, whereas for a wavelength of 1 μm, a thickness of 0.5 μm may be sufficient. The corresponding numbers for 90% absorption are 50 μm and 1.5 μm for wavelengths of 1.55 and 1 μm, respectively. Sensor thicknesses can, however, be kept much thinner (for example, 1-2 μm or 0.5-1 μm or even 0.2-0.5 μm) in the short wavelength region from about 1 to 1.3 μm when an avalanche region is introduced in the readout wafer at or close to the bonding interface. Such Ge/Si avalanche photodiodes have been fabricated by epitaxial Ge growth for photonics applications (see, for example, Y. Kang et al. in Nature Photonics 3, 59 (2009), and J. E. Bowers et al. in Proc. Of SPIE 7660, 76603H (2010), the entire disclosures of which are hereby incorporated by reference). A bonded Ge wafer can be thinned to a thickness of 1 µm or even below, for example, by grinding, spin etching or plasma etching, and chemical mechanical planarization, or by a low-temperature layer transfer technique as known in the art (see, for example, I. P. Ferain et al. in J. Appl. Phys. 107, 054315 (2010), the entire disclosure of which is hereby incorporated by reference).

In order to reduce dark leakage currents, the detectors may have to be cooled, for example, by a Peltier element. When no avalanche region is present, it may be advisable to operate the detector under conditions for which both the Si below the charge collector of the readout wafer and the sensor wafer reach near full depletion for efficient charge collection.

Display Example

The pixel detector of the invention may be used in a CMOS integrated pixelated LED display system, wherein the sign of the bias voltage applied to the back contact 19, 29, 39, 49 is reversed, so that the p-n junctions 18, 28, 38, 48 are polarized in the forward direction in which implants 15, 25, 35, 45, 123, 223 act as current injectors rather than charge collectors. In this application, back contact 19, 29, 39, 49, 262 may optionally be patterned. The p-n junction 18, 28, 38, 48 is preferably contained in absorber wafer 16, 26, 36, 46, 220, acting now as emitter wafer 16, 26, 36, 46, 220, in which under forward biased p-n junction 18, 28, 38, 48 electron-hole pairs recombine, resulting in photon emission rather than electron-hole generation under photon absorption as in the reverse process of light detection. CMOS processed wafer 11, 21, 31, 41, 165, 215 may optionally comprise heavily doped layer 21', 41', 127', 167', 217' doped with the same doping sign as current injectors 15, 25, 35, 45, 123, 223. Absorber/emitter wafer 16, 26, 36, 46, 220 may on the other hand comprise heavily doped layer 51', 224 with the same doping sign, forming low resistance junction with heavily doped layer 21', 41', 127', 167', 217' for improved charge injection across covalently bonded interface 17, 27, 37, 47, 237. Emitter wafer 16, 26, 36, 46, 220 may, for example, comprise a stack with GaN, AlGaN and AlInGaN barrier layers and InGaN layers acting as quantum wells, emitting in the red, green and blue region of the optical spectrum, where individual pixel colors can be chosen by equipping the pixelated LED layer with appropriate filters. Epitaxial growth of these III-V semiconductor layers onto large Si substrates, which are covalently bonded to thinned CMOS wafers by methods of the invention, may provide an economical way of manufacturing high-resolution, high-contrast displays for example for mobile phones. The size of individual LEDs in such a pixel array may for example be in the range of 80-100 µm, or 60-80 µm, or 40-60 µm, or 20-40 µm or even 10-20 µm.

Mass Spectrometry Imaging Example

The pixel detector of the invention may be used in systems and methods for mass spectrometry imaging (MSI). There are two different approaches for MSI: (1) secondary ion mass spectrometry (SIMS) that uses a charged primary ion beam for ionization and (2) matrix-assisted laser desorption-ionization (MALDI) that uses a focused laser light source. Both modes may use pixel detectors. For microscope mode SIMS, see, for example, A. Kiss et al. in Rev. Sci. Instrum. 84 (2013), the entire disclosure of which is hereby incorporated by reference. For MALDI, see, for example, J. H. Jungmann et al., in J. Am. Soc. Mass Spectrom. 21, 2023 (2010), the entire disclosure of which is hereby incorporated by reference. For example, the pixelated absorber of the invention incorporating small absorber patches and thinned drift region of the readout wafer may give rise to exceptionally high spatial resolution due to reduced backscattering in the absorber patches. The resolution of the pixel detector of the invention may be as high as 5-20 µm or even 1-5 µm.

Non-Destructive Testing Example

The pixel detector of the invention may be used in systems and methods for non-destructive testing, for example, in a computed tomography (CT) setup (see, for example, S. Procz et al. in JINST 8, C01025 (2013), the entire disclosure of which is hereby incorporated by reference). The pixel detector of the invention also offers the advantage of easier and cheaper scalability to large size simplifying a CT setup. The pixel detector of the invention may also be used in digital radiography for inspections, for example, because of higher sensitivity in comparison to amorphous-Se based flat panel detectors (see, for example, S. Kasap et al. in Sensors 11, 5112 (2011), the entire disclosure of which is hereby incorporated by reference).

Security Example

The pixel detector of the invention may be used, for example, in systems and methods for the detection and analysis of liquids in airplane luggage and in other applications requiring high sensitivity and spectral resolution. For example, sensors made from elemental semiconductors offer much better resolution and uniformity compared to sensors made from compound semiconductors (see, for example, D. Pennicard et al. in JINST 9, P12003 (2014), the entire disclosure of which is hereby incorporated by reference). High purity Ge detectors may, for example, have a resolution (FWHM) below 1 keV at an energy of 122 keV (see, for example, www.canberra.com, the entire disclosure of which is hereby incorporated by reference). The pixel detector of the invention may comprise a covalently bonded Ge wafer with a thickness, for example, in between 0.5-2 mm. in order to reduce dark leakage currents the detector may be cooled, for example, to liquid nitrogen temperature or to a temperature of about −20° C. to −80° C. Alternatively, pixel detectors incorporating highly resistive GaAs, CdTe or CdZnTe sensors do not require any cooling. Moreover, high-Z sensors such as CdTe and CdZnTe are more sensitive at photon energies above about 40 keV.

Projection Radiography Example

The pixel detector of the invention is used in a digital radiography system in which the X-rays transmitted through an object are converted into electrical signals, generating digital information, which is transmitted and converted into an image displayed on a computer screen either locally or remotely.

There are many disease states in which classic diagnosis is obtained by plain radiographs. In addition, systems and methods incorporating the pixel detector of the present invention may be used for 3-dimensional imaging as, for example, in computed tomography. Examples of systems and methods include those to diagnose various types of arthritis and pneumonia, bone tumors, fractures, congenital skeletal anomalies, and the like.

Mammography Example

The pixel detector of the invention may be used in mammography, wherein high spatial resolution and good contrast is essential in identifying micro-calcification. The pixel detector incorporating epitaxial SiGe absorption layers may be especially suited for mammography applications, incorporating tomosynthesis, wherein X-ray tube voltages are operated below 40 keV such that for alloys with high Ge content (for example, 70-80%) absorption layer thicknesses of 100-300 µm provide sufficient absorption. The single photon counting capability of this detector permits easy implementation of dual-energy or multiple-energy operation which has proven highly advantageous for contrast enhancement (see, for example, M. D. Hörnig et al. in Proc. of SPIE Vol. 8313, 831340 (2012), the entire disclosure of which is hereby incorporated by reference). The spatial resolution of the pixel detector of the invention may, for example, range within 100-200 µm or preferably 50-100 µm or even 20-50 µm.

In case of even smaller pixel size, for example, of 10-20 µm or even 5-10 µm, the pixel detector of the invention may allow for X-ray phase contrast imaging wherein the absorption grating in front of the detector is eliminated. This makes systems incorporating such detectors far less complex and easier to align and handle. It furthermore permits a dose reduction by a factor of two, for example, when the detector of the invention is used in phase-contrast imaging for microcalcification analysis in mammography.

Interventional Radiology Example

The introduction of the monolithic CMOS integrated pixel detector allows for the replacement of the cesium iodide (CsI) screen in fluoroscope designs. Therefore "four dimensional computed tomography" (4DCT) is more accurate than "fluoroscopy" to define this detector used of the invention even if the field of applications is the same. The photon counting monolithic CMOS integrated pixel detectors allow real-time imaging of anatomical structures in motion, and the method is optionally augmented with a radio-contrast agent. Radio-contrast agents are administered by swallowing or injecting into the body of the patient to delineate anatomy, function of the blood vessels and various systems, e.g. the genitor-urinary system or the gastro-intestinal tract. Two radio-contrast agents are presently in common use. Barium sulfate (BaSO4) is administered to the subject orally or rectally for evaluation of the gastro-intestinal tract. Iodine in various formulations is given by oral, rectal, intra-arterial or intravenous pathways. These radio-contrast agents absorb or scatter X-rays, and in conjunction with real-time imaging, permit the imaging of dynamic physiological processes in the digestive tract or blood flow in the vascular system. Iodine contrast agents are also concentrated in abnormal areas in different concentrations than in normal tissues to make abnormalities (e.g. tumors, cysts, inflamed areas) visible. Furthermore, the energy resolution offered by the photon counting detectors of the invention provides additional image contrast, so that the contrast agents can be reduced in concentration or even fully eliminated.

More generally, cone beam computed tomography (CBCT) is used in interventional radiology systems and methods. Interventional radiology includes minimally invasive procedures that are guided by imaging systems utilizing systems and methods having the pixel detectors described herein, especially the pixel detectors incorporating high-Z sensors. These procedures are diagnostic or involve treatments, such as angiographic intervention and the systems used therewith. Exemplary systems include those procedures to diagnose and/or treat peripheral vascular disease, renal artery stenosis, inferior vena cava filter placement, gastrostomy tube placement, biliary stent intervention, and hepatic intervention. Non-angiographic procedures such as image guided orthopedic, thoracic, abdominal, head and neck, and neuro surgery, biopsies, brachytherapy or external beam radiotherapy, percutaneous drain and stent placement or radiofrequency ablation are also included. Images created with the assistance of the systems utilizing the pixel detector are used for guidance. The images created with the assistance of the photon counting pixel detector provide maps that permit the interventional radiologist to guide instruments through the body of a subject to the areas containing disease conditions. These systems and methods minimize the physical tissue trauma to the subject, reduce infection rates, recovery times, and hospitalization stays, such as in angiographic interventions, or non-angiographic procedures like image guided orthopedic, thoracic, abdominal, head and neck, and neuro surgery, biopsies, brachytherapy or external beam radiotherapy, percutaneous drain and stent placement or radiofrequency ablation.

In sum, the pixel detector of the invention includes several components. A first component is a silicon readout wafer 11, 21, 31, 120, 130, 165, 215, 415, 515 with at least one high resistivity layer 127, 167, 217, 417, 517 doped to have a first conduction type, the layer having a CMOS processed readout electronics. A second component are implants for charge collectors 15, 25, 35, 123, 223, 423, 523 doped to have the first conduction type, the implants communicating with the readout electronics and defining the detector pixels. A third component is an absorber wafer 16, 26, 36, 220, 481, 541' made from single crystal material having at least a second conduction type and a metallic back contact 19, 29, 39, 262, 472, 572. A fourth component are contact pads 124, 254, 464, 564 communicating with an external printed circuit board. The silicon wafer and the absorber wafer are covalently bonded to form a monolithic unit. The monolithic unit incorporates a p-n junction formed by a layer of the first conduction type and a layer of the second conduction type. The depletion region of the p-n junction is disposed to extend across the bonding interface 17, 27, 37, 237, 437, 537 to separate electron-hole pairs into charges travelling in opposite directions when the electron-hole pairs are generated by electromagnetic radiation absorbed in the absorber wafer and when a reverse bias is applied to the back contact. The charge collectors are disposed to receive the electrical charges crossing the bonded interface. The readout electronics is disposed to convert the electrical charges into digital signals which can pass through contact pads 124, 254, 464, 564 to the external printed circuit board. Here, they can be stored, processed and displayed as images on a computer screen. When the silicon wafer 11, 21, 31, 41, 217 and silicon layers 21', 41', 217', and the absorber wafer 16, 26, 36, 46, 220 and absorber wafer layers 51', 51, 52, 224 are doped to higher doping levels, the pixel detector of the invention can be operated in detector mode, when the p-n junction 18, 28, 38, 48 is biased in the reverse direction, and in display mode, when the p-n junction 18, 28, 38, 48 is biased in the forward direction.

It should be appreciated that the particular implementations shown and herein described are representative of the invention and its best mode and are not intended to limit the scope of the present invention in any way.

The invention may be summarized as in the following points:

1. A monolithic CMOS integrated pixel detector 10, 20, 30, 40, 260, 470, 570 for the detection of electromagnetic radiation, comprising a. a silicon readout wafer 11, 21, 31, 41, 120, 130, 165, 215, 415, 515 with at least one layer 127, 167, 217, 417, 517 doped to have a first conduction type, the layer comprising CMOS processed readout electronics;
b. implants for charge collectors 15, 25, 35, 45, 123, 223, 423, 523 doped to have the first conduction type, the implants communicating with the readout electronics and defining detector pixels;
c. an absorber wafer 16, 26, 36, 46, 220, 481, 541' made from material comprising at least a second conduction type and a metallic back contact 19, 29, 39, 49, 262, 472, 572; and,
d. contact pads 124, 254, 464, 564 communicating with an external printed circuit board;

wherein the silicon wafer and the absorber wafer are covalently bonded to form a monolithic unit; and wherein the monolithic unit comprises a p-n junction formed by a layer of the first conduction type and a layer of the second conduction type; and wherein charge collectors are disposed to receive the electrical charges crossing the bonded interface; and wherein registered charges are processed by a processor typically for diagnostic purposes.

2. The detector of feature set 1, wherein further, the depletion region of the p-n junction is disposed to extend across the bonding interface 17, 27, 37, 237, 437, 537 to separate electron-hole pairs into charges travelling in opposite directions when the electron-hole pairs are generated by electromagnetic radiation absorbed in the absorber wafer and when a reverse bias is applied to the back contact.

3. The detector of feature set 1, wherein the readout electronics is disposed to convert said electrical charges into digital signals which can pass through contact pads 124, 254, 464, 564 to the external printed circuit board to be stored, processed and/or displayed as images on a computer screen.

4. The detector of feature set 1, wherein the absorber wafer 16, 26, 36, 46, 220, 481, 541' is made from single crystal material.

5. The monolithic CMOS integrated pixel detector of any of the above feature sets, wherein the p-n junction 18 is located at the bonded interface 17, 27, 37, 237, 437, 537.

6. The monolithic CMOS integrated pixel detector of any of the feature sets 1 to 4, wherein the silicon readout wafer 11, 21, 31, 120, 130, 165, 215, 415, 515 comprises a high resistivity layer 127', 167', 217', 417', 517' doped to have the second conduction type, and wherein the p-n junction 28 is located within the silicon readout wafer 11, 21, 31, 120, 130, 165, 215, 415, 515.

7. The monolithic CMOS integrated pixel detector of any of the feature sets 1 to 4, wherein the absorber wafer 46, 220, 381, 481, 541' comprises a layer 51, 224, 319', 425', 533 of the first conduction type, and wherein the p-n junction is located within the absorber wafer 46, 220, 381, 481, 541'.

8. The monolithic CMOS integrated pixel detector of any of the above feature sets, wherein the pixel size is defined by the spacing of the implants for charge collectors.

9. The monolithic CMOS integrated pixel detector of feature set 8, wherein the pixel size is selected from one of a list of ranges, consisting of 5-20 μm, 20-50 μm, 50-100 μm and 100-200 μm.

10. The monolithic CMOS integrated pixel detector of any of feature sets 1 to 9, wherein the readout wafer has a thickness of about 10-100 μm.

11. The monolithic CMOS integrated pixel detector of any of feature sets 1 to 9, wherein the readout wafer has a thickness of 10-50 μm.

12. The monolithic CMOS integrated pixel detector of any of feature sets 1 to 9, wherein the readout wafer has a thickness of 10-20 μm.

13. The monolithic CMOS integrated pixel detector of feature set 1, wherein the at least one doped layer 127, 167, 217, 417, 517 of the readout wafer is a high resistivity layer with a resistivity selected from one of a list of ranges consisting of 1-2 kΩcm, 2-5 kΩcm and 5-50 kΩcm.

14. The monolithic CMOS integrated pixel detector of feature set 6, wherein the layer 127', 167', 217', 417', 517' of the readout wafer has a resistivity selected from one of a list of ranges consisting of 1-2 kΩcm, 2-5 kΩcm and 5-50 kΩcm.

15. The monolithic CMOS integrated pixel detector of feature set 1, wherein the absorber wafer comprises a material selected from one of the group of materials consisting of Si, SiC, Ge, a SiGe alloy, GaAs, CdTe, a CdZnTe alloy, GaN, a AlGaN alloy, a InGaN alloy, and a AlInGaN alloy.

16. The monolithic CMOS integrated pixel detector of feature set 1, wherein the absorber wafer comprises an epitaxial absorption layer on a silicon substrate.

17. The monolithic CMOS integrated pixel detector of feature set 16, wherein the silicon substrate has a resistivity selected from one of a list of ranges consisting of 1-2 kΩcm, 2-5 kΩcm and 5-50 kΩcm.

18. The monolithic CMOS integrated pixel detector of any of feature sets 16 or 17, wherein the silicon substrate comprises a thickness within range of thicknesses selected from one of a list of ranges consisting of 10-30 μm and 15-20 μm.

19. The monolithic CMOS integrated pixel detector of any one of feature sets 16 to 18, wherein the Si substrate is patterned in the form of pillars separated by trenches, wherein the pillar width is selected from one of a group of widths consisting of 1-100 μm and 2-20 μm, and wherein the width of trenches are selected from one of a group of widths consisting of 2-6 μm and 3-5 μm.

20. The monolithic CMOS integrated pixel detector of any one of feature sets 16 to 19, wherein the epitaxial absorption layer is a SiGe alloy layer.

21. The monolithic CMOS integrated pixel detector of feature set 20, wherein the SiGe alloy layer is pixelated.

22. The monolithic CMOS integrated pixel detector of feature set 21, wherein the pixelated SiGe alloy layer has a Ge content of between 20 and 80%.

23. The monolithic CMOS integrated pixel detector of feature set 21, wherein the pixelated SiGe alloy layer has a Ge content of between 70 and 80%.

24. The monolithic CMOS integrated pixel detector of feature set 21, wherein the pixelated SiGe alloy layer is compositionally graded up to a final Ge content.

25. The monolithic CMOS integrated pixel detector of feature set 24, wherein the final Ge content is a content selected from one of a range of contents consisting of 20-80% and 70-80%.

26. The monolithic CMOS integrated pixel detector of feature set 16, wherein the epitaxial absorption layer is a Ge layer width a thickness within a range of thicknesses selected from one of a list of ranges consisting of 0.5-1.5 μm, 0.4-1.0 μm and 0.2-0.5 μm.

27. The monolithic CMOS integrated pixel detector of any one of feature sets 20 to 25, wherein the epitaxial absorption layer has a thickness of between 100 and 300 μm.

28. A method for forming a monolithic CMOS integrated pixel detector for the detection of electromagnetic radiation, the method comprising the steps of:
   a. providing a silicon wafer comprising at least one doped Si layer 117, 127, 167, 217, 417, 517 doped to have a first conduction type;
   b. forming a readout wafer 120, 215, 415, 515 with a field oxide 125, 216, 416, 516 by CMOS processing a readout electronics in the at least one doped Si layer 117, 127, 167, 217, 417, 517;
   c. forming implants for charge collectors 15, 25, 35, 45, 123, 223, 423, 523 doped to have the first conduction type, the implants communicating with the readout electronics and defining detector pixels;
   d. forming contact pads 124, 254, 464, 564 to connect the readout electronics to a printed circuit board of the outside world;
   e. providing an absorber wafer 16, 26, 36, 46, 220, 381, 481, 541' comprising at least a layer of a second conduction type;
   f. forming a low-temperature covalent bond 17, 27, 37, 47, 237, 437, 537 between the readout wafer and the absorber wafer;
   g. forming a metallic back contact 262, 472, 572 on the surface 221, 442, 543 of the absorber wafer 220, 481, 541';
   wherein the layers of the first conduction type and the layers of the second conduction type are disposed to form a p-n junction, the depletion region of which extends across the bonding interface 17, 27, 37, 47, 237, 437, 537 when a reverse bias is applied to the metallic back contact, thereby separating electron-hole pairs into charges travelling in opposite directions when generated by electromagnetic radiation absorbed in the absorber wafer; and wherein the charge collectors are disposed to receive the electrical charges crossing the bonded interface; and wherein the readout electronics is disposed to convert said electrical charges into digital signals which can be transmitted through contact pads 124, 254, 464, 564 to an external printed circuit board and further stored, processed and displayed as images on a computer screen.

29. The method of feature set 28, wherein forming said low-temperature covalent bond 17, 27, 37, 47, 237, 437, 537 between the readout wafer and the absorber wafer comprises steps of:
   a. planarizing the readout wafer 130, 165, 215, 415, 515 by planarizing its oxide surface 132 and rendering it essentially particle-free and activated for low-temperature oxide-to-oxide fusion bonding;
   b. providing an oxidized Si carrier wafer 140, 213, 413, 513 and rendering its surface 143 essentially particle-free and plasma activated for low-temperature oxide-to-oxide fusion bonding;
   c. forming a bonded wafer stack 150, 410, 510 by bonding the activated oxide surface 132 of the readout wafer onto the activated surface 143 of the carrier wafer in a low-temperature oxide-to-oxide wafer bond;
   d. thinning the readout wafer 165, 215, 415, 515 bonded to the carrier wafer;
   e. activating the surface 211, 411 of the readout wafer and the surface 222, 386, 422 of the absorber wafer by rendering them essentially oxide-free and damage-free by one of a list of steps consisting of HF dip and plasma activation;
   f. removing the carrier wafer 140, 213, 413, 513 at least partially from the readout wafer 245, 415, 515 after forming said low-temperature covalent bond 17, 27, 37, 47, 237, 437, 537;
   g. opening the contact holes 252, 462, 562 to expose the electrical contact pads 124, 254, 464, 564 providing electrical connections to the printed circuit board.

30. The method of feature set 28, wherein forming the monolithic CMOS integrated pixel detector comprises steps of:
   a. providing a silicon-on-insulator (SOI) wafer; and
   b. forming the readout wafer 120, 160, 210, 415, 515 by CMOS processing the readout electronics in the SOI wafer.

31. The method of one of feature sets 28 to 30, wherein providing the absorber wafer comprises steps of:
   c. providing a substrate wafer 310 from a list of wafers comprising at least a high resistivity silicon wafer and a silicon-on-insulator (SOI) wafer comprising a Si substrate 313, oxide box 314 and a high resistivity Si layer 317 of a thickness of 10-30 μm made up of at least one layer 319, 425 of the second conduction type;
   d. patterning the Si layer in the form of pillars 328 separated by trenches 329;
   e. growing an epitaxial absorption layer in the form of separated crystals 331, 441 of the second conduction type;
   f. filling the trenches between Si pillars and epitaxial crystals with a filling material 349;
   g. forming an oxide layer 351, 428 on the surface 332 of the epitaxial crystals 331;
   h. planarizing the oxide layer 351, 428 and rendering its surface 352 particle-free and plasma activated for low-temperature oxide-to-oxide fusion bonding;
   i. providing a carrier wafer 360, 426 made of oxidized Si or fused quartz and rendering its upper surface 362 particle-free and plasma activated for low-temperature oxide-to-oxide fusion bonding;
   j. forming a strong oxide-to-oxide fusion bond 371, 424 between surface 352 of the absorber wafer and surface 362 of the carrier wafer; and
   k. forming a thinned absorber wafer 381, 481 by removing the substrate wafer 310.

32. The method of one of feature sets 28 to 30, wherein providing the absorber wafer comprises steps of:
   a. providing a substrate wafer 310 from a list of wafers comprising at least a silicon wafer and a silicon-on-insulator (SOI) wafer comprising a Si substrate 313, oxide box 314 and a Si layer 317, 527 of a thickness of 10-30 μm;
   b. patterning the Si layer in the form of pillars 328 separated by trenches 329;
   c. growing an epitaxial absorption layer in the form of separated crystals 331, 541 of the second conduction type;
   d. filling the trenches between Si pillars and epitaxial crystals with a filling material 349; and
   e. planarizing the surface 522 of the epitaxial crystals.

33. A system for near-infrared detection comprising the pixel detector of feature set 1.

34. The system of feature set 33, wherein the pixel detector is adapted for the detection of short wavelength infrared radiation in the wavelength range of 1-1.6 μm.

35. The system of feature set 33, wherein the at least one silicon layer 127, 217, 417 of the readout wafer comprises an avalanche region.

36. The system of feature 34, wherein the at least one silicon layer 127, 217, 417, 517 of the readout wafer comprises an avalanche region.
37. A system for security applications comprising the pixel detector of feature set 1.
38. The system of feature set 37, wherein the pixel detector is adapted for high spectral resolution for the detection and analysis of liquids in airplane luggage.
39. A system for mammography applications comprising the pixel detector of feature set 1.
40. The system of feature set 39, wherein the pixel detector is adapted for high spatial and spectral resolution at X-ray tube voltages operated below 40 keV to permit reliable identification of micro-calcification in women's breasts.
41. A system for high resolution displays comprising the pixel detector of feature set 1.
42. The system of feature set 41, wherein the absorber wafer is configured to act as an emitter wafer under bias conditions inverse to those of detector operations.
43. The system of feature set 41, wherein the pixel detector is configured to operate under bias conditions inverse to those of detector operation in order to act as a high resolution LED pixel array.
44. The high resolution LED pixel array of feature set 43, wherein the size of the LED pixels is a size selected from one of a list of sizes consisting of 80-100 µm, 60-80 µm, 40-60 µm, 20-40 µm and 10-20 µm.
45. The system of one of feature sets 42-44, wherein the emitter wafer comprises a stack of semiconductor layers chosen from a list of semiconductor layers comprising at least GaN, GaAlN, AlGaInN and GaInN layers.

Many applications of the present invention may be formulated. One skilled in the art will appreciate that the network may include any system for exchanging data, such as, for example, the Internet, an intranet, an extranet, WAN, LAN, wireless network, satellite communications, and/or the like. It is noted that the network may be implemented as other types of networks, such as an interactive television network. The users may interact with the system via any input device such as a keyboard, mouse, kiosk, personal digital assistant, handheld computer, cellular phone and/or the like. Moreover, the system contemplates the use, sale and/or distribution of any goods, services or information having similar functionality described herein.

As will be appreciated by skilled artisans, the present invention may be embodied as a system, a device, or a method.

The present invention is described herein with reference to process sequences, devices, components, and modules, according to various aspects of the invention. Moreover, the system contemplates the use, sale and/or distribution of any goods, services or information having similar functionality described herein.

The specification and figures should be considered in an illustrative manner, rather than a restrictive one and all modifications described herein are intended to be included within the scope of the invention claimed. Accordingly, the scope of the invention should be determined by the appended claims (as they currently exist or as later amended or added, and their legal equivalents) rather than by merely the examples described above. Steps recited in any method or process claims, unless otherwise expressly stated, may be executed in any order and are not limited to the specific order presented in any claim. Further, the elements and/or components recited in apparatus claims may be assembled or otherwise functionally configured in a variety of permutations to produce substantially the same result as the present invention. Consequently, the invention should not be interpreted as being limited to the specific configuration recited in the claims.

Benefits, other advantages and solutions mentioned herein are not to be construed as critical, required or essential features or components of any or all the claims.

As used herein, the terms "comprises", "comprising", or variations thereof, are intended to refer to a non-exclusive listing of elements, such that any apparatus, process, method, article, or composition of the invention that comprises a list of elements, that does not include only those elements recited, but may also include other elements such as those described in the instant specification. Unless otherwise explicitly stated, the use of the term "consisting" or "consisting of" or "consisting essentially of" is not intended to limit the scope of the invention to the enumerated elements named thereafter, unless otherwise indicated. Other combinations and/or modifications of the above-described elements, materials or structures used in the practice of the present invention may be varied or adapted by the skilled artisan to other designs without departing from the general principles of the invention.

The patents and articles mentioned above are hereby incorporated by reference herein, unless otherwise noted, to the extent that the same are not inconsistent with this disclosure.

Other characteristics and modes of execution of the invention are described in the appended claims.

Further, the invention should be considered as comprising all possible combinations of every feature described in the instant specification, appended claims, and/or drawing figures which may be considered new, inventive and industrially applicable.

Copyright may be owned by the Applicant(s) or their assignee and, with respect to express Licensees to third parties of the rights defined in one or more claims herein, no implied license is granted herein to use the invention as defined in the remaining claims. Further, vis-à-vis the public or third parties, no express or implied license is granted to prepare derivative works based on this patent specification, inclusive of the appendix hereto and any computer program comprised therein.

Additional features and functionality of the invention are described in the claims appended hereto. Such claims are hereby incorporated in their entirety by reference thereto in this specification and should be considered as part of the application as filed.

Multiple variations and modifications are possible in the embodiments of the invention described here. Although certain illustrative embodiments of the invention have been shown and described here, a wide range of changes, modifications, and substitutions is contemplated in the foregoing disclosure. While the above description contains many specific details, these should not be construed as limitations on the scope of the invention, but rather exemplify one or another preferred embodiment thereof. In some instances, some features of the present invention may be employed without a corresponding use of the other features. Accordingly, it is appropriate that the foregoing description be construed broadly and understood as being illustrative only, the spirit and scope of the invention being limited only by the claims which ultimately issue in this application.

ADDENDUM

The following US patent documents, foreign patent documents, and Additional Publications are incorporated herein by reference thereto, as if fully set forth herein, and relied upon:

US Patent Documents

| | | | |
|---|---|---|---|
| 8,237,126 | B2 | August 2012 | von Känel et al. |
| 6,410,940 | B1 | June 2002 | Hongxing Jiang et al. |

Other Patent Documents

| | | | |
|---|---|---|---|
| EP0571135 | A2 | November 1993 | Collins et al. |
| WO 2016/097850 | A1 | June 2016 | von Känel |

Additional Publications medipix.web.cern.ch
www.dectris.ch
www.nist.gov/pml/data/ffast
www.canberra.com
www.virginiasemi.com/pdf/generalpropertiesSi62002.pdf Åberg I. et al., "A low dark current and high quantum efficiency monolithic germanium-on-silicon CMOS imager technology for day and night imaging applications", International Electron Devices Meeting (IEDM), San Francisco, 2010, pp. 344-347

Alig R. C. et al., "Scattering by ionization and phonon emission in semiconductors", Physical Review B 22, 5565-5582 (1980)

Alig R. C. "Scattering by ionization and phonon emission in semiconductors. II. Monte Carlo calculations", Physical Review B 27, 968-977 (1983)

Bowers J. E. et al., "High-gain high-sensitivity resonant Ge/Si APD photodetectors", Proc. of SPIE 7660, 76603H (2010)

Colace L. et al., "Low Dark-Current Germanium-on-Silicon Near-Infrared Detectors", IEEE Photonics Technology Letters 19, 1813-1815 (2007)

Day J. et al., "III-nitride full-scale high-resolution microdisplays", Applied Physics Letters 99, 031116 (2011)

Deptuch G. W. et al., "Vertically integrated circuits at Fermilab", IEEE Trans. Nucl. Sci. 57, 2178-2186 (2010)

Del Sordo S. et al., "Progress in the Development of CdTe and CdZnTe Semiconductor Radiation Detectors for Astrophysical and Medical Applications", Sensors 2009, 9, 3491-3526

Ferain I. P. et al., "Low temperature exfoliation process in hydrogen-implanted germanium layers", J. Appl. Phys. 107, 054315 (2010)

Flötgen C. et al., "Novel surface preparation methods for covalent and conductive bonded interfaces fabrication", ECS Transactions 64, 103-110 (2014)

Hörnig M. D. et al., "Design of a contrast-enhanced dual-energy tomosynthesis system for breast cancer imaging", Proc. of SPIE Vol. 8313, 831340 (2012)

Jungmann J. H. et al., "Fast, High Resolution Mass Spectrometry Imaging Using a Medipix Pixelated Detector", J. Am. Soc. Mass Spectrom. 21, 2023-2030 (2010)

Kang Y. et al., "Monolithic germanium/silicon avalanche photodiodes with 340 GHz gain-bandwidth product", Nature Photonics 3, 59-63 (2009)

Kasap S. et al., "Amorphous and polycrystalline photoconductors for direct conversion flat panel X-ray image sensors", Sensors 11, 5112-5157 (2011)

Kiss A. et al., "Microscope mode secondary ion mass spectrometry imaging with a Timepix detector", Rev. Sci. Instrum. 84, 013704 (2013)

Mattiazzo S. et al., "LePIX: First results from a novel monolithic pixel sensor", Nucl. Instr. Meth. Phys. Res. A 718, 288-291 (2013)

Plach T. et al., "Mechanisms for room temperature direct wafer bonding", J. Appl. Phys. 113, 094905 (2013)

Procz S. et al., "Medipix3 CT for material sciences", JINST, 8 C01025 (2013)

Rafferty C. S. et al., "Monolithic germanium SWIR imaging array", Proc. of SPIE 6940, 69400N (2008)

Snoeys W., "Monolithic pixel detectors for high energy physics", Nucl. Instr. Meth. Phys. Res. A 731, 125-130 (2013)

Veale, M. C. et al., "Chromium compensated gallium arsenide detectors for X-ray and γ-ray spectroscopic imaging", Nucl Instr. Meth. Phys. Res, A 752, 6-14 (2014)

Weber J. et al., "Near-band-gap photoluminescence of Si—Ge alloys", Physical Review B 40, 5683-5693 (1989)

What is claimed is:

1. A monolithic CMOS integrated pixel detector for the detection of electromagnetic radiation, comprising
   a) a silicon readout wafer with at least one layer doped to have a first conduction type, the layer comprising CMOS processed readout electronics;
   b) implants for charge collectors doped to have the first conduction type, the implants communicating with the readout electronics and defining detector pixels;
   c) an absorber wafer made from material comprising at least a second conduction type and a metallic back contact; and,
   d) contact pads configured to allow the CMOS processed readout electronics to communicate with an external printed circuit board;
wherein the silicon wafer and the absorber wafer are covalently bonded to form a monolithic unit; and wherein the monolithic unit comprises a p-n junction formed by a layer of the first conduction type and a layer of the second conduction type, wherein the p-n junction is located at the bonded interface; and wherein charge collectors are disposed to receive the electrical charges crossing the bonded interface.

2. The detector of claim 1, wherein further, the depletion region of the p-n junction is disposed to extend across the bonding interface to separate electron-hole pairs into charges travelling in opposite directions when the electron-hole pairs are generated by electromagnetic radiation absorbed in the absorber wafer and when a reverse bias is applied to the back contact.

3. The detector of claim 1, wherein the readout electronics is disposed to convert said electrical charges into digital signals which can pass through contact pads to the external printed circuit board to be stored, processed and/or displayed as images on a computer screen.

4. The detector of claim 1, wherein the absorber wafer is made from single crystal material.

5. The monolithic CMOS integrated pixel detector of claim 1, wherein the silicon readout wafer comprises a high resistivity layer doped to have the second conduction type, and wherein a p-n junction is located within the silicon readout wafer.

6. The monolithic CMOS integrated pixel detector of claim 1, wherein the absorber wafer comprises a layer of the first conduction type, and wherein a p-n junction is located within the absorber wafer.

7. The monolithic CMOS integrated pixel detector of claim 1, wherein the pixel size is defined by the spacing of the implants for charge collectors.

8. The monolithic CMOS integrated pixel detector of claim 7, wherein the pixel size is selected from one of a list of ranges, consisting of 5-20 µm, 20-50 µm, 50-100 µm and 100-200 µm.

9. The monolithic CMOS integrated pixel detector of claim 1, wherein the readout wafer has a thickness of about 10-100 µm.

10. The monolithic CMOS integrated pixel detector of claim 1, wherein the readout wafer has a thickness of 10-50 µm.

11. The monolithic CMOS integrated pixel detector of claim 1, wherein the readout wafer has a thickness of 10-20 µm.

12. The monolithic CMOS integrated pixel detector of claim 1, wherein the at least one doped layer of the readout wafer is a high resistivity layer with a resistivity selected from one of a list of ranges consisting of 1-2 kΩcm, 2-5 kΩcm and 5-50 kΩcm.

13. The monolithic CMOS integrated pixel detector of claim 5, wherein the layer of the readout wafer has a resistivity selected from one of a list of ranges consisting of 1-2 kΩcm, 2-5 kΩcm and 5-50 kΩcm.

14. The monolithic CMOS integrated pixel detector of claim 1, wherein the absorber wafer comprises a material selected from one of the group of materials consisting of Si, SiC, Ge, a SiGe alloy, GaAs, CdTe, a CdZnTe alloy, GaN, a AlGaN alloy, a InGaN alloy, and a AlInGaN alloy.

15. The monolithic CMOS integrated pixel detector of claim 1, wherein the absorber wafer comprises an epitaxial absorption layer on a silicon substrate.

16. The monolithic CMOS integrated pixel detector of claim 15, wherein the silicon substrate has a resistivity selected from one of a list of ranges consisting of 1-2 kΩcm, 2-5 kΩcm and 5-50 kΩcm.

17. The monolithic CMOS integrated pixel detector of claim 15, wherein the silicon substrate comprises a thickness within range of thicknesses selected from one of a list of ranges consisting of 10-30 µm and 15-20 µm.

18. The monolithic CMOS integrated pixel detector of claim 15, wherein the Si substrate is patterned in the form of pillars separated by trenches, wherein the pillar width is selected from one of a group of widths consisting of 1-100 µm and 2-20 µm, and wherein the width of trenches is selected from one of a group of widths consisting of 2-6 µm and 3-5 µm.

19. The monolithic CMOS integrated pixel detector of claim 15, wherein the epitaxial absorption layer is a SiGe alloy layer.

20. The monolithic CMOS integrated pixel detector of claim 19, wherein the SiGe alloy layer is pixelated.

21. The monolithic CMOS integrated pixel detector of claim 20, wherein the pixelated SiGe alloy layer has a Ge content of between 20 and 80%.

22. The monolithic CMOS integrated pixel detector of claim 20, wherein the pixelated SiGe alloy layer has a Ge content of between 70 and 80%.

23. The monolithic CMOS integrated pixel detector of claim 20, wherein the pixelated SiGe alloy layer is compositionally graded up to a final Ge content.

24. The monolithic CMOS integrated pixel detector of claim 23, wherein the final Ge content is a content selected from one of a range of contents consisting of 20-80% and 70-80%.

25. The monolithic CMOS integrated pixel detector of claim 15, wherein the epitaxial absorption layer is a Ge layer width a thickness within a range of thicknesses selected from one of a list of ranges consisting of 0.5-1.5 µm, 0.4-1.0 µm and 0.2-0.5 µm.

26. The monolithic CMOS integrated pixel detector of claim 19, wherein the epitaxial absorption layer has a thickness of between 100 and 300 µm.

27. A method for forming a monolithic CMOS integrated pixel detector for the detection of electromagnetic radiation, the method comprising the steps of:
  a) providing a silicon wafer comprising at least one doped Si layer doped to have a first conduction type;
  b) forming a readout wafer with a field oxide by CMOS processing a readout electronics in the at least one doped Si layer;
  c) forming implants for charge collectors doped to have the first conduction type, the implants communicating with the readout electronics and defining detector pixels;
  d) forming contact pads to connect the readout electronics to an external printed circuit board;
  e) providing an absorber wafer comprising at least a layer of a second conduction type;
  f) forming a low-temperature covalent bond between the readout wafer and the absorber wafer;
  g) forming a metallic back contact on the surface of the absorber wafer;
  wherein the layers of the first conduction type and the layers of the second conduction type are disposed to form a p-n junction, wherein the p-n junction is located at the bonded interface, the depletion region of which extends across the bonding interface when a reverse bias is applied to the metallic back contact, thereby separating electron-hole pairs into charges travelling in opposite directions when generated by electromagnetic radiation absorbed in the absorber wafer; and wherein the charge collectors are disposed to receive the electrical charges crossing the bonded interface; and wherein the readout electronics is disposed to convert said electrical charges into digital signals which can be transmitted through the contact pads to the external printed circuit board and further stored, processed and displayed as images on a computer screen.

28. The method of claim 27, wherein forming said low-temperature covalent bond between the readout wafer and the absorber wafer comprises steps of:
  a) planarizing the readout wafer by planarizing its oxide surface and rendering it essentially particle-free and activated for low-temperature oxide-to-oxide fusion bonding;
  b) providing an oxidized Si carrier wafer and rendering its surface essentially particle-free and plasma activated for low-temperature oxide-to-oxide fusion bonding;
  c) forming a bonded wafer stack by bonding the activated oxide surface of the readout wafer onto the activated surface of the carrier wafer in a low-temperature oxide-to-oxide wafer bond;

d) thinning and planarizing the readout wafer bonded to the carrier wafer to provide a planarizing surface of the readout wafer;

e) activating the planarized surface of the readout wafer and the surface of the absorber wafer by rendering them essentially oxide-free and damage-free by one of a list of steps consisting of HF dip and plasma activation;

f) removing the carrier wafer at least partially from the readout wafer after forming said low-temperature covalent bond;

g) opening contact holes to expose the electrical contact pads providing the electrical connections to the printed circuit board.

29. The method of claim 27, wherein forming the monolithic CMOS integrated pixel detector comprises steps of:

a) providing a silicon-on-insulator (SOI) wafer; and b) forming the readout wafer by CMOS processing the readout electronics in the SOI wafer.

30. The method of claim 27, wherein providing the absorber wafer comprises steps of:

a) providing a substrate wafer from a list of wafers comprising at least a high resistivity silicon wafer and a silicon-on-insulator (SOI) wafer comprising a Si substrate, oxide box and a high resistivity Si layer of a thickness of 10-30 µm made up of at least one layer of the second conduction type;

b) patterning the Si layer in the form of pillars separated by trenches;

c) growing an epitaxial absorption layer in the form of separated crystals of the second conduction type to provide an epitaxial absorber wafer;

d) filling the trenches between Si pillars and epitaxial crystals with a filling material;

e) forming an oxide layer on the surface f the epitaxial crystals;

f) planarizing the oxide layer and rendering its surface particle-free and plasma activated to provide an activated planarized surface of the epitaxial absorber wafer for low-temperature oxide-to-oxide fusion bonding;

g) providing a carrier wafer made of oxidized Si or fused quartz and rendering a surface particle-free and plasma activated for low-temperature oxide-to-oxide fusion bonding;

h) forming a strong oxide-to-oxide fusion bond between the activated planarized surface of the epitaxial absorber wafer and a surface of the carrier wafer; and i) forming a thinned absorber wafer by removing the substrate wafer of the epitaxial absorber wafer.

31. The method of claim 27, wherein providing the absorber wafer comprises steps of:

a) providing a substrate wafer from a list of wafers comprising at least a silicon wafer and a silicon-on-insulator (SOI) wafer comprising a Si substrate, oxide box and a Si layer of a thickness of 10-30 µm;

b) patterning the Si layer in the form of pillars separated by trenches;

c) growing an epitaxial absorption layer in the form of separated crystals of the second conduction type;

d) filling the trenches between Si pillars and epitaxial crystals with a filling material; and e) planarizing the surface of the epitaxial crystals.

32. A system for near-infrared detection comprising the pixel detector of claim 1.

33. The system of claim 32, wherein the pixel detector is adapted for the detection of short wavelength infrared radiation in the wavelength range of 1-1.6 µm.

34. The system of claim 32, wherein the at least one silicon layer of the readout wafer comprises an avalanche region.

35. The system of claim 33, wherein the at least one silicon of the readout wafer comprises an avalanche region.

36. A system for security applications comprising the pixel detector of claim 1.

37. The system of claim 36, wherein the pixel detector is adapted for high spectral resolution for the detection and analysis of liquids in airplane luggage.

38. A system for mammography applications comprising the pixel detector of claim 1.

39. The system of claim 38, wherein the pixel detector is adapted for high spatial and spectral resolution at X-ray tube voltages operated below 40 keV to permit reliable identification of micro-calcification in women's breasts.

40. A system for high resolution displays comprising the pixel detector of claim 1.

41. The system of claim 40, wherein the absorber wafer is configured to act as an emitter wafer under bias conditions inverse to those of detector operations.

42. The system of claim 40, wherein the pixel detector is configured to operate under bias conditions inverse to those of detector operation in order to act as a high resolution LED pixel array.

43. The high-resolution LED pixel array of claim 42, wherein the size of the LED pixels is a size selected from one of a list of sizes consisting of 80-100 µm, 60-80 µm, 40-60 µm, 20-40 µm and 10-20 µm.

44. The system of claim 41, wherein the emitter wafer comprises a stack of semiconductor layers chosen from a list of semiconductor layers comprising at least GaN, GaAlN, AlGaInN and GaInN layers.

* * * * *